United States Patent
Aliane et al.

(10) Patent No.: US 11,967,665 B2
(45) Date of Patent: Apr. 23, 2024

(54) METHOD FOR MANUFACTURING A DETECTION STRUCTURE WITH AN OPTIMISED ABSORPTION RATE, AND SAID STRUCTURE

(71) Applicant: COMMISSARIAT A L'ENERGIE ATOMIQUE ET AUX ENERGIES ALTERNATIVES, Paris (FR)

(72) Inventors: Abdelkader Aliane, Grenoble (FR); Jean-Louis Ouvrier-Buffet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 420 days.

(21) Appl. No.: 17/312,616

(22) PCT Filed: Dec. 11, 2019

(86) PCT No.: PCT/FR2019/053017
§ 371 (c)(1),
(2) Date: Jun. 10, 2021

(87) PCT Pub. No.: WO2020/120905
PCT Pub. Date: Jun. 18, 2020

(65) Prior Publication Data
US 2022/0020892 A1   Jan. 20, 2022

(30) Foreign Application Priority Data

Dec. 13, 2018   (FR) ..................... 18 72785

(51) Int. Cl.
*H01L 31/113*   (2006.01)
*G01J 5/02*   (2022.01)
(Continued)

(52) U.S. Cl.
CPC .......... *H01L 31/1136* (2013.01); *G01J 5/024* (2013.01); *G01J 5/0853* (2013.01); *G01J 5/24* (2013.01)

(58) Field of Classification Search
CPC ........... H01L 31/1136; H01L 29/66742; H01L 29/78651; G01J 5/024; G01J 5/0853; G01J 5/24; G01J 5/20
See application file for complete search history.

(56) References Cited

U.S. PATENT DOCUMENTS 9,667,121 B2   5/2017   Aliane et al.
10,145,812 B2   12/2018   Aliane et al.
(Continued)

FOREIGN PATENT DOCUMENTS

CN   103050412 B   10/2015
DE   29 09 320 A1   9/1979
WO   WO 2018/055276 A1   3/2018

OTHER PUBLICATIONS

U.S. Appl. No. 17/296,033, filed May 21, 2021, Abdelkader Aliane et al.
(Continued)

*Primary Examiner* — Kyoung Lee
(74) *Attorney, Agent, or Firm* — Oblon, McClelland, Maier & Neustadt, L.L.P.

(57) ABSTRACT

A method for forming a detection structure for detecting electromagnetic radiation includes an MOS transistor as a transducer. The method is based on the use of lateral extension elements as a doping mask for the semiconductor layer of the transistor and an etching mask for the same semiconductor layer, in order to provide contact portions of a drain and a source of the transistor.

16 Claims, 18 Drawing Sheets

(51) Int. Cl.
    *G01J 5/08*           (2022.01)
    *G01J 5/24*           (2006.01)

(56) References Cited

U.S. PATENT DOCUMENTS

| | | | |
|---|---|---|---|
| 10,498,259 | B2 | 12/2019 | Aliane |
| 2015/0084102 | A1* | 3/2015 | Park .................... H01L 29/6653 |
| | | | 257/288 |
| 2019/0271598 | A1 | 9/2019 | Yon et al. |

OTHER PUBLICATIONS

U.S. Appl. No. 14/617,042, filed Feb. 9, 2015, US 2015/0226612 A1, Ujwol Palanchoke et al.

International Search Report issued on Mar. 24, 2020 in PCT/FR2019/053017 filed on Dec. 11, 2019, citing references AA and AO-AQ therein, 2 pages.

Preliminary French Search Report issued on Nov. 5, 2019 in French Patent Application No. 18 72785 filed on Dec. 13, 2018 (with translation of category of cited documents), citing references AO-AQ therein, 2 pages.

\* cited by examiner

METHOD FOR MANUFACTURING A DETECTION STRUCTURE WITH AN OPTIMISED ABSORPTION RATE, AND SAID STRUCTURE

CROSS-REFERENCE TO RELATED APPLICATIONS

This application is a U.S. national phase application of PCT Application No. PCT/FR2019/053017 filed on Dec. 11, 2019, which claims priority to France Patent Application No. 18 72785 filed on Dec. 13, 2018, the entire contents of which are incorporated by reference herein.

STATEMENT REGARDING FEDERALLY SPONSORED RESEARCH OR DEVELOPMENT

This invention results from a contract awarded by the French Ministry of Defence, which has certain rights over it.

TECHNICAL FIELD

The invention relates to structures for detecting electromagnetic radiations, especially in the infrared range.

More precisely, the object of the invention is a structure for detecting electromagnetic radiation and a method for manufacturing such a structure.

STATE OF PRIOR ART

In order to detect electromagnetic radiations, especially in the infrared wavelength range, it is known to use bolometer-type electromagnetic radiation detection structures.

Such a structure comprises:
  an absorbing element configured to absorb electromagnetic radiation, typically provided in the form of a suspended membrane,
  a transducer having a characteristic which varies with temperature, the transducer being associated with the absorbing element to enable detection of the temperature rise of said absorbing element upon absorbing the electromagnetic radiation.

In order to allow a reduction in the size of these structures, it has recently been provided to use MOS transistors as the transducer.

In accordance with document WO2018055276 A1, the transistor of a structure according to such a possibility comprises:
  at least one first and at least one second zone of a first conductivity type,
  at least one third zone separating the first and second zones from each other, the third zone being of a second conductivity type opposite to the first conductivity type and having a concentration of majority carriers lower than the first and second zones,
  at least one first gate electrode arranged to bias the third zone.

At least one metallization of such a transistor, especially the gate electrode, forms the absorbing element of the detection structure.

In this configuration, in accordance with FIG. 1B of document WO2018055276 A1, the first, third and fourth zones follow each other along the absorption plane to form the drain, channel and source of the MOS transistor respectively.

If a detection structure according to this possibility described in document WO2018055276 A1 allows provision of a good absorption of the electromagnetic radiation to be detected, this especially by optimizing the absorbing element, this absorption is still not optimal.

Indeed, even though, in accordance with its teaching, it is possible to provide an absorbing element having an impedance close to that of the vacuum, that is in the order of $376.9\Omega$, the total impedance of the structure, which is that perceived by the electromagnetic wave to be absorbed, is in reality lower and thus does not allow an optimal absorption to be obtained. Indeed this impedance involves, in addition to the absorbing element, all the elements of the transistor, including especially the first and second zones, which are heavily doped and the silicides they contain, can drastically reduce the impedance perceived by the electromagnetic wave. As a result, the equivalent resistance perceived by the electromagnetic radiation is generally between 1 and $100\Omega/\square$, which is relatively far from the $376.9\Omega/\square$ that would be necessary to optimise absorption of the electromagnetic radiation by the absorbing element.

DISCLOSURE OF THE INVENTION

The invention aims at overcoming this drawback and thus its purpose is to provide a method for manufacturing a detection structure comprising a MOS transistor as a transducer and which is likely to have an absorption rate higher than a structure of prior art having, for the rest of these characteristics, a similar configuration.

To this end, the invention relates to a method for manufacturing a structure for detecting electromagnetic radiations, said electromagnetic detection structure comprising a MOS transistor as a transducer, the method comprising the following steps of:
  providing a semiconductor layer having a first concentration of majority carriers, said semiconductor layer being either of an intrinsic type or of a first conductivity type,
  depositing at least one first dielectric material onto the surface of the semiconductor layer to form a first insulating layer,
  depositing a first conductive material in contact with the first insulating layer to form a first conductive layer,
  depositing a masking layer in contact with the first conductive layer,
  locally etching the masking layer and the conductive layer in order to form a masking layer/first conductive layer assembly, the first conductive layer thus etched at least partly forming a gate electrode of the MOS transistor by covering a first part of the first semiconductor layer,
  firstly implanting doping elements in the semiconductor layer, the first part of the semiconductor layer being protected by the masking layer/first conductive layer assembly, and said implantation being carried out with a first dose adapted to provide a second concentration of majority carriers higher than the first concentration, said doping elements being capable of providing majority carriers of a given type of conductivity,
  forming a first and a second lateral extension element made of at least one dielectric material in contact with the first insulating layer on either side of the masking layer/first conductive layer assembly and, said first and second lateral extension elements extending from the masking layer/first conductive layer assembly opposite to each other,
  secondly implanting doping elements in the semiconductor layer, a second part of the semiconductor layer, comprising the first part of the semiconductor layer, being protected by the masking layer/first conductive layer assembly and the first and second lateral extension elements extending therefrom, said second implantation being carried out with a second dose higher than the first dose and adapted to provide a third concentration of majority carriers higher than the second concentration, said doping elements being capable of providing majority carriers of the given conductivity type, thermally annealing the semiconductor layer, the thermal annealing being adapted to diffuse and activate the doping elements implanted during the first and second implantation, so as to form a first and second zone of the transistor with, for each of the first and second zones, a first region having a concentration of majority carriers strictly higher than the second concentration and a second region having a concentration of majority carriers equal to or lower than the second concentration, said first region being partly covered with the first and second lateral extension elements respectively, said first and second zones being separated from each other by a third zone of the transistor covered with the first insulating layer, locally etching the parts of the semiconductor layer not protected by the masking layer/first conductive layer assembly and the first and second lateral extension elements extending therefrom, said selective etching making it possible to keep only the parts of the first regions of each of the first and second zones protected by the first and second lateral extension elements and, if applicable, by the masking layer/first conductive layer assembly, depositing at least one second conductive material to form a first and a second metal contact in contact with an etch flank corresponding to the first and second lateral extension elements, respectively, at least one of the gate electrode, at least one of the first and second metal contacts forming an absorbing element configured to absorb the electromagnetic radiation, the MOS transistor being thus formed.

The inventors have noticed that in a structure such as that described in document WO2018055276 A1, the doped zones, which are the first and second zones, have a major role in decreasing the equivalent impedance of the absorbing element perceived by the radiation. More precisely, this decrease in equivalent impedance is mainly due to the first overdoped contact regions of the zones and to the siliciding thereof.

However, the method according to the invention allows a good control of the dimensions of these last zones and their overdoped regions, since these first overdoped regions have their dimensions defined by the controlled diffusion of doping elements implanted during the second implantation. Indeed, the use of the lateral extension elements as a mask both for doping at the second concentration and etching the semiconductor layer, ensures that the first region of each of the first and second zones is only provided by the diffusion of the doping elements under the first and second lateral extension elements since these same first regions are delimited by said lateral extension elements. It is thus possible, with the method according to the invention, to provide first regions of the first and second zones having a minimal volume.

In this way, it is possible to obtain, with a structure according to the invention, an optimisation of both the absorption of the electromagnetic radiation, by optimising the equivalent impedance of the absorbing element that it allows, and of the drain-source current, by optimising the length of the channel that it allows, with respect to a structure of prior art comprising a MOS transistor as a transducer.

It will be noted that the MOS transistor is, in a conventional configuration of the invention, a MOSFET transistor.

By concentration of majority carriers, it is meant, above and in the rest of this document, the concentration of carriers, among the concentration of holes and that of electrons, which is the most important. Thus, in the case where the concentration of majority carriers relates to a layer or zone made of an intrinsic semiconductor, the concentration of holes and electrons being substantially the same, said concentration of majority carriers corresponds to the concentration of electrons which is therefore substantially the same as that of holes.

According to a conventional configuration of the invention, the semiconductor layer is of a first conductivity type and the conductivity type is of a second conductivity type opposite to the first conductivity type.

Of course, alternatively, the configuration may be one of:
the semiconductor layer has a first conductivity type and the conductivity type is the first conductivity type, the MOS transistor then being of the N+NN+ or P+PP+ type,
the semiconductor layer is of the intrinsic type and the given conductivity type is one of the conductivity type in which the majority carriers are electrons, that is of an N doping, and the conductivity type in which the majority carriers are holes, that is of a P doping, the MOS transistor being then of the NiN or PiP type.

In the step of forming a masking layer, the masking layer can be made of an at least partially conductive material, The gate electrode is formed by the masking layer and the at least one first conductive material.

Thus, the method is particularly optimised in that the masking layer does not have to be removed and is used to form the gate electrode.

The material of the masking layer may be a polycrystalline silicon.

The masking material may be an unintentionally doped polycrystalline silicon, the gate electrode being formed by the at least one first conductive material and the masking layer being provided with an opening to allow biasing of the gate electrode.

Such an unintentionally doped polycrystalline silicon layer is particularly advantageous since it has a low influence on the impedance of the first conductive layer, the latter thus being particularly adapted to absorb the electromagnetic radiation.

Of course, the masking material can also be doped.

By unintentionally doped material, also known as intrinsic doping, it is understood that during the formation of said material, no doping element of any conductivity type has been added. In other words, such an unintentionally doped material has a concentration of majority carriers lower than $1 \cdot 10^{15}$ cm$^{-3}$ or even $5 \cdot 10^{14}$ cm$^{-3}$.

The manufacturing method can further include, between the step of locally etching the parts of the semiconductor layer and the step of depositing at least one second conductive material, a step of siliciding the etch flanks corresponding to the first and second lateral extension elements respectively.

In this way it is possible to have an optimised contact between the first and second metal contacts and the first and second zones, this ohmic contact being provided by the contact layers formed during said siliciding step.

It will be noted that this configuration fully benefits from the advantages relative to the invention, since this optimised contact is not made at the expense of a modification in the impedance of the absorbing element over a large surface area due to the presence of these contact layers on the flanks of the semiconductor layer and therefore the resulting orientation perpendicular to the absorption plane.

The method for manufacturing a structure for detecting electromagnetic radiation can include, after the step of selectively etching parts of the semiconductor layer, a step of removing the masking layer.

During the deposition of the at least one first conductive material and the at least one second conductive material, the at least one of the gate, first and second metal contacts forming the absorbing element can extend beyond the semiconductor layer. After the step of selectively etching the parts of the semiconductor layer not protected by the masking layer/first conductive layer assembly and the first and second lateral extension elements extending therefrom, the semiconductor layer can at least partly surround a zone of an absorption plane defined by the absorbing element, the absorbing element extending at least partly over said zone of said absorption plane.

In this way, the absorbing element has an equivalent impedance over the portions extending beyond the semiconductor layer which is not influenced by the semiconductor layer. It is therefore easy to provide an absorbing element which has, at least at said portion extending beyond the semiconductor layer, an impedance optimised to allow absorption of electromagnetic radiation.

The absorbing element can comprise a metal layer and is supported by a dielectric layer, the metal of the metal layer of the absorbing element and the thicknesses of said layer and the dielectric layer supporting it being chosen so as to meet the following inequalities: $150\Omega \leq \rho/Ep \leq 700\Omega$ with $\rho$ the equivalent resistivity of said layers and Ep the sum of the thicknesses of said layers.

Thus, for the part extending along the zone of said absorption plane, the absorbing element has an equivalent impedance optimised to promote absorption of the electromagnetic radiation.

The invention further relates to a structure for detecting electromagnetic radiations, the structure comprising a MOS transistor as a transducer, the MOS transistor comprising:
a first and a second zone of a second conductivity type and a third zone of a first conductivity type opposite to the second conductivity type, the third zone separating the first and second zones from each other, said first, second and third zones being arranged in a semiconductor layer, the third zone having a first concentration of majority carriers and the first and second zones each having a concentration of majority carriers higher than the first concentration by including a first region and a second region, said first regions having a concentration of majority carriers strictly higher than a second concentration of majority carriers and said second regions having a concentration of majority carriers equal to or lower than said second concentration, said second concentration being higher than the first concentration,
a first insulating layer made of a first dielectric material in contact with the semiconductor layer and covering said first, second and third zones,
a first conductive layer made of a first conductive material in contact with the first insulating layer and participating in the formation of a gate electrode of the MOS transistor,
a first and a second lateral extension elements made of a dielectric material in contact with the insulating layer and extending from the first conductive layer opposite to each other, said first and second lateral extension elements at least partly covering the first regions of the first and second zones by delimiting them laterally,
at least one first and one second metal contact in contact with a flank of the semiconductor layer corresponding to the first and second lateral extension elements respectively, at least one of the gate electrode, the first and second metal contacts forming an absorbing element configured to absorb the electromagnetic radiation.

It will be noted that such a lateral delimitation of the first regions of the first and second zones by the lateral extension elements is obtained with one end of each first and second lateral extension element being aligned with a respective flank of the semiconductor layer in a direction perpendicular to a plane of the semiconductor layer.

Such a structure has, according to the principle of the invention, an optimised absorption.

The detection structure can further comprise a masking layer covering the first conductive layer.

The material of the masking layer can be a doped polycrystalline silicon, said masking layer forming with the first conductive layer a gate electrode.

A detection structure can be manufactured with an optimised manufacturing method, since the masking layer does not have to be removed, as it participates in the formation of the gate electrode.

Hence, this makes it easier to make contact with the gate electrode.

The material of the masking layer can be an unintentionally doped polycrystalline silicon, the gate electrode being formed by the first conductive layer, and the masking layer being provided with an opening in order to allow biasing of the gate electrode.

In this way, it is possible to have an optimised contact between the first and second metal contacts and the first and second zones, this ohmic contact being provided by the contact layers.

It will be noted that this configuration fully benefits from the advantages relative to the invention, since this optimised contact is not made at the expense of a modification in the impedance of the absorbing element over a large surface area due to the presence of these contact layers on the flanks of the semiconductor layer and therefore the resulting orientation perpendicular to the absorption plane.

The semiconductor layer can at least partly surround a zone of an absorption plane defined by the absorbing element, the absorbing element extending at least partly over said zone of said absorption plane.

Such a part of the absorbing element extending over such a zone of the absorption plane readily provides, at said zone, an absorbing element having an equivalent impedance optimised for absorption of the electromagnetic radiation.

The absorbing element can comprise a metal layer and can be supported by a dielectric layer, the metal of the metal layer of the absorbing element and the thicknesses of said layer and of the dielectric layer supporting it being chosen so as to meet the following inequalities: $150\Omega \leq \rho/Ep \leq 700\Omega$ with ρ the equivalent resistivity of said layers and Ep the sum of the thicknesses of said layers.

Thus, for the part extending along the zone of said absorption plane, the absorbing element has an equivalent impedance optimised to promote absorption of the electromagnetic radiation.

The semiconductor layer can comprise, on each of the flanks corresponding to the first and second lateral extension elements respectively, a contact layer formed of a silicide material, said material being preferentially selected from nickel silicide, titanium silicide, cobalt silicide and platinum silicide.

It will be noted that this configuration fully benefits from the advantages relative to the invention, since this optimised contact is not made at the expense of a modification of the impedance of the absorbing element over a large surface area due to the presence of these contact layers on the flanks of the semiconductor layer and therefore the resulting orientation perpendicular to the absorption plane.

BRIEF DESCRIPTION OF THE DRAWINGS

The present invention will be better understood upon reading the description of exemplary embodiments, given purely by way of indication and in no way limiting purposes, with reference to the appended drawings in which.

Identical, similar or equivalent parts in the various figures bear the same reference numerals so as to facilitate switching from one figure to another.

Figure 1:
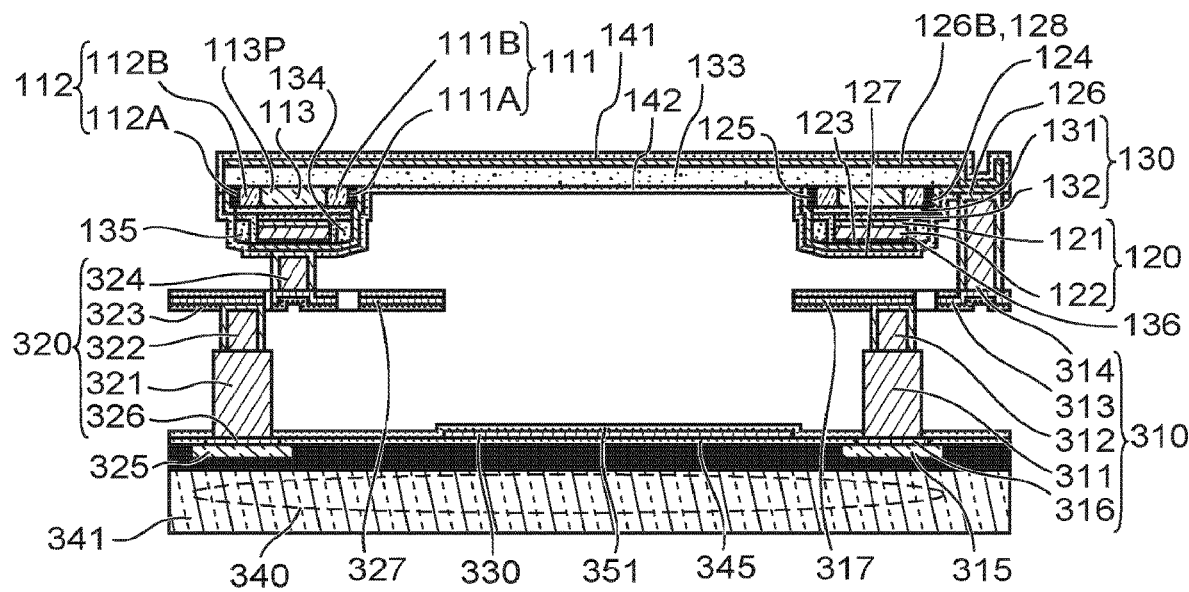
FIG. 1 illustrates a cross-section view of a detection structure according to the invention.

The different parts represented in the figures are not necessarily drawn to a uniform scale, to make the figures more legible.

DETAILED DISCLOSURE OF PARTICULAR EMBODIMENTS

FIG. 1A schematically illustrates a bolometer-type detection structure 10 according to the invention, such a detection structure 10 being adapted for the detection of an electromagnetic radiation.

Such a detection structure 10 is more particularly directed to the detection of electromagnetic radiations in the infrared wavelength range. Thus, the various values given in the embodiments described below relate to this practical application, in which the target wavelength range is far infrared, that is between 8 and 12 μm. Of course, these values are provided only as a non-limiting example, as the person skilled in the art is quite capable, on the basis of the present disclosure, of adapting these values in order to allow, using such a detection structure 10, the optimised detection of electromagnetic radiations in a wavelength range other than that of infrared.

Such a detection structure 10 includes:
  a transistor 100 of the MOS type associated with the absorbing element 128 to detect the temperature rise of said absorbing element 128 upon absorbing the electromagnetic radiation by the latter, the transistor including:
    at least one first and at least one second zone 111, 112 of a first conductivity type,
    at least one third zone 113 separating the first and second zones 111, 112 from each other, the third zone 113 having a first concentration of majority carriers lower than that of the first and second zones 111, 112, the third zone 113 has a second conductivity type opposite to the first conductivity type,
    a gate oxide 130, comprising at least one first insulating layer 131,
    a gate electrode 120,
    a first and second lateral extension element 134, 135, 136 of dielectric material and extending at least partly from the gate electrode 120,
    a first and a second metal contact 127, 126, 126B, of the first zone 111 and the gate electrode 120, respectively, and the second zone 112, the second metal contact 126, 126B forming an absorbing element 128 of the structure 10, said absorbing element defining an absorption plane,
  a first and a second thermal insulation arm 310, 320 including respectively a first and a second conduction track 317, 327 to allow biasing of the transistor 100, the first conduction track 317 being connected to the second zone 112 through the second metal contact 127, the second track 327 being connected to the first zone 111 and the gate electrode 120 by short-circuiting them through the first metal contact 126, 126B,
  an optional reflection surface 330, 331 disposed to form a quarter-wave cavity with the absorbing element 128,
  a readout circuit 340 of which only the substrate 341 is shown, the readout circuit 340 being electrically connected to the first and second conduction tracks 311, 321 via a first and second contact zone 315, 325 respectively.

The first, second and third zones 111, 112, 113 are all arranged in a first semiconductor layer 113P. In one usual configuration of the invention, the first semiconductor layer 113P is made of monocrystalline silicon Si. Of course, other semiconductor materials than silicon are contemplatable to form the first semiconductor layer 113P without departing from the scope of the invention. Thus, alternatively, the semiconductor layer can be made of another semiconductor material, such as germanium Ge and silicon carbide SiC, without departing from the scope of the invention.

Figure 2A:
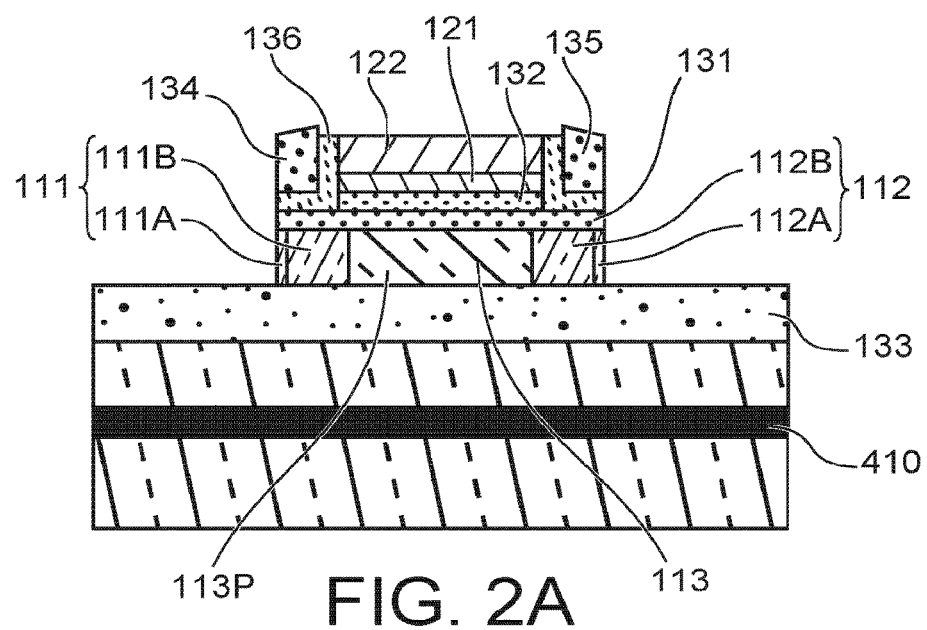
FIGS. 2A and 2B illustrate a MOS transistor of a detection structure as illustrated in FIG. 1 prior to forming its metallisations according to a cross-sectional view and a top view respectively, FIGS. 3A to 3ZC illustrate, by means of transverse cross-section views, the preliminary steps of forming an intermediate substrate for the formation of a MOS transistor of a detection structure as illustrated in FIG. 1, FIGS. 4A to 4N illustrate, by means of transverse cross-section views, the steps of forming a control substrate, assembling said control substrate with the intermediate substrate illustrated in FIG. 3ZC and finalising the detection structure illustrated in FIG. 1.

The first semiconductor layer 113P can have, for example, a thickness between 10 and 500 nm, or even between 50 and 150 nm, which can be substantially equal to 70 nm. As shown in FIG. 1 and FIG. 2A, the first semiconductor layer is supported by a fourth insulating layer 133, the fourth insulating layer being a layer made of a dielectric material, such as silicon dioxide and can, for example, have a thickness between 50 and 300 nm, or even between 100 and 200 nm and preferably substantially equal to 145 nm.

As shown in FIG. 2A, which illustrates a close-up cross-section view of a portion of the transistor 100 being manufactured, the first, third and second zones 111, 112, 113 follow one another along the first semiconductor layer 113P with the third zone 113 separating the first and second zones 111, 112. Thus, the first and second zones 111, 112 are each arranged at a respective lateral side opposite to each other. In this way, the first and second zones can be contacted by means of lateral contacts of said first semiconductor layer 113P.

The third zone 113 has a concentration of majority carriers which is lower than that of the first and second zones 111, 112, and which is preferentially significantly lower than those of the first and second zones 111, 112, that is the first concentration is preferentially lower than 10 times the minimum concentration of majority carriers of the first and second zones 111, 112, or even 50 times or 100 times the minimum concentration of majority carriers of the first and second zones 111, 112. According to a practical application, the third layer 113P has a P doping with a concentration of majority carriers of between $1 \cdot 10^{14}$ and $1 \cdot 10^{17}$ cm$^{-3}$, or even between $5 \cdot 10^{14}$ and $5 \cdot 10^{15}$ cm$^{-3}$.

Thus, according to an alternative of the invention, the third zone can be of the intrinsic semiconductor type, that is it has substantially the same concentration of electrons and holes. In such an alternative of the invention, the MOS transistor 100 is of a type selected from NiN transistors and PiP transistors.

According to the principle of the invention, the first and second zones 111, 112 comprise a first region 111A, 112A and a second region 111B, 112B. Said first regions 111A, 112A have a concentration of majority carriers strictly higher than a second concentration of majority carriers and said second regions 111B, 112B have a concentration of majority carriers equal to or lower than said second concentration, said second concentration being higher than the first concentration.

Thus, the second concentration of majority carriers can be between $1 \cdot 10^{17}$ and $1 \cdot 10^{19}$ cm$^{-3}$ or even between $5 \cdot 10^{17}$ and $5 \cdot 10^{18}$ cm$^{-3}$ and is, in any case, higher than the first concentration. According to this possibility, the first region 111A, 112A can have a maximum concentration of majority carriers corresponding to a third concentration of majority carriers between $1 \cdot 10^{19}$ and $1 \cdot 10^{21}$ cm$^{-3}$ or even between $5 \cdot 10^{19}$ and $5 \cdot 10^{20}$ cm$^{-3}$, said third concentration being in any case higher than the first concentration. According to the practical application, the first and second zones 111, 112 have an N doping.

Of course, alternatively, the first and second zones can have a P doping, the third zone having an N doping.

It will be noted that, alternatively, the first and second zones 111, 112 can be of the same conductivity type as that of the third zone 113. Thus, according to this possibility, the MOS transistor 100 is of a type selected from N+NN+ transistors and P+PP+ transistors.

Figure 2B:
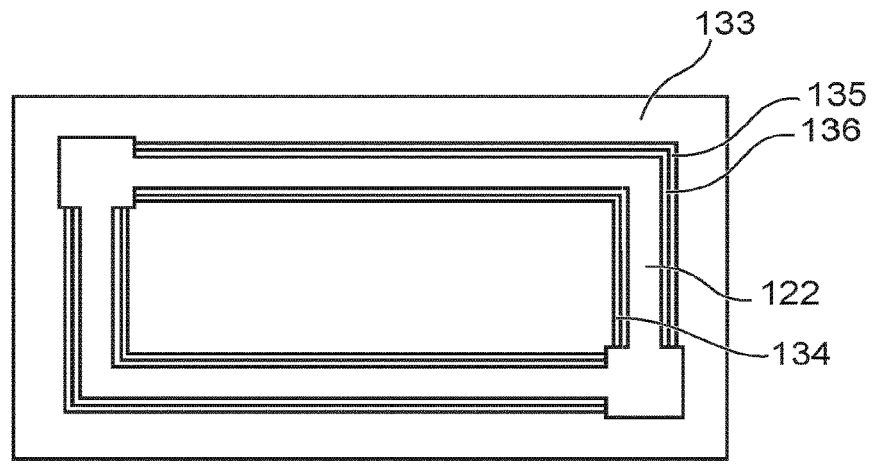

As illustrated in FIGS. 2A and 2B, the succession of the first, second and third zones 111, 112, 113 extends along a closed line which is, according to the possibility illustrated in FIG. 2B, rectangular. In other words, the first, second and third zones 111, 112, 113 extend in concentric rectangles, with the first zone 111 extending in an inner rectangle, the third zone 113 extending in an intermediate rectangle and the second zone 112 extending in the outer rectangle, that is it surrounds the other two rectangles. Of course, such a shape is provided only as an example and said succession of the first, third and second zones 111, 113, 112 may, of course, extend according to another shape, this shape being able to correspond to an open or closed line.

It will nevertheless be noted that, preferably, the succession formed by the first, second and third zones 111, 112, 113 is arranged to surround at least partly a zone of the absorption plane. The absorbing element 128 extends at least partly over said zone of the absorption plane. According to this possibility, the succession formed by the first, second and third zones 111, 112, 113 can for example have a configuration which is:

comb-shaped, the zones of the absorption plane surrounded being the zones disposed between the arms of the comb, or serpentine-shaped, the zones of the absorption plane surrounded being the zones defined between the bends of the serpentine.

According to such a possibility, as illustrated in FIGS. 2A and 2B, the absorbing element 128 extends along an absorption plane with a majority portion, that is accounting for more than 50% of the surface area of the absorbing element, of the absorbing element 128 being outside a projection of the semiconductor layer 113P on said absorption plane. Of course, such a majority portion can be obtained other than with an arrangement of the succession formed by the first, second and third zones 111, 112, 113 to surround at least one zone of the absorption plane. Indeed, and for example, such a majority portion can be obtained with an absorbing element 128 extending beyond the succession formed by the first, second and third zones 111, 112, 113.

The first semiconductor layer is, as illustrated in FIGS. 1 and 2A, covered with a second insulating layer 131.

The second insulating layer 131 is made of a dielectric material, such as for example silicon dioxide $SiO_2$. The second insulating layer 131 can have a thickness between 1 and 50 nm, preferably between 2 and 25 nm.

The second insulating layer 131 is covered with the first insulating layer 132 and with a third insulating layer, the third insulating layer 136 laterally extending from the first insulating layer 132.

The first insulating layer 132 is made of a first dielectric material which is of a dielectric material having a higher dielectric coefficient than silicon dioxide, this type of dielectric being generally known as high-K. Thus, for example, the first insulating layer 132 can be made of hafnium dioxide $HfO_2$ or an aluminium oxide, such as alumina $Al_2O_3$.

The third insulating layer 136 is made of a dielectric material, such as silicon dioxide $SiO_2$.

The first insulating layer 132 is covered with a first conductive layer 121.

The first conductive layer 121 is made of a conductive material. According to one embodiment of the invention, the material of the first conductive layer 121 is preferentially a "mid-gap" type metal for the third zone 113. Thus, in the case where the third zone 113 is of silicon, as is the case in this embodiment of the invention, the material of the first conductive layer is preferentially a metal selected from the group including titanium nitrides TiN, tantalum nitrides TaN and molybdenum silicides $MoSi_2$.

It is meant above and in the remainder of this document by "mid-gap type metal" that the metal is chosen so as to have, in the absence of biasing of the structure, its Fermi energy in the band gap region of the third zone 113 and more precisely in the vicinity of the mid-gap of the third zone 113, typically at an energy level distant from the mid-gap in a range between −25% and +25% of the band gap. Such a gate configuration is generally known to the person skilled in the art as a "mid-gap". Thus, in the case where the third zone is made of silicon, the "the mid-gap type metals" include especially titanium nitrides TiN, tantalum nitrides TaN and molybdenum silicides $MoSi_2$.

Thus, in this embodiment of the invention, the first conductive layer 121 is preferentially made of titanium nitride TiN and preferentially has a thickness between 5 and 15 nm or even equal to 10 nm.

The first conductive layer 121 is itself covered with a masking layer 122 forming a second conductive layer according to a first possibility of the invention.

The masking layer 122, in this embodiment of the invention, is of polycrystalline silicon pSi with a thickness of between 10 and 150 nm, preferentially between 20 and 100 nm and advantageously substantially equal to 50 nm.

According to a particularly advantageous alternative of the invention not illustrated, the masking layer 122 is made of unintentionally doped polycrystalline silicon pSi. According to this alternative of the invention, the first conductive layer alone forms the gate electrode and the masking layer has an opening to allow contacting the first conductive layer through the masking layer 122.

Nevertheless according to the present embodiment of the invention, and in order to promote contacting of the gate electrode 120 formed by the first conductive layer and the masking layer 122, the masking layer 122 may be made of a doped polycrystalline silicon pSi.

In this first embodiment, the first conductive layer 121 and the masking layer 122 together form the gate electrode 120.

The first and second lateral extension elements 134, 135, 136, also known as spacers, are disposed on either side of the first conductive layer 121 and the masking layer 122 and extending from said first conductive layer 121 and masking layer 122. The first and second lateral extension elements comprise the third insulating layer 136 and first and second lateral extension portions 134, 135 of dielectric material. Thus, the material of each of the first and second lateral extension portions 134, 135 can be selected from silicon dioxide SiO$_2$ and silicon nitride SiN.

Each of said first and second lateral extension elements at least partly cover the first regions of the first and second zones 111, 112 by laterally delimiting them. Thus, the first and second lateral extension elements 134, 135, 136 laterally and respectively delimit the first regions 111A, 112A of the first and second zones 111, 112. More precisely, such lateral delimitation is provided by alignment of an end of each first and second lateral extension element 134, 135, 136 with a respective flank of the semiconductor layer 113P in a direction perpendicular to a plane of the semiconductor layer 113P.

Each of the first and second zones 111, 112 and the second masking layer 122 has a first, second and third contact layer 125, 124, 123 respectively. Each of the first, second and third contact layers 125, 124, 123 is formed of a silicide material, said material being selected from nickel silicide NiSi, titanium silicide TiSi, cobalt silicide CoSi and platinum silicide PtSi.

The first and third contact layers 125, 123 are both in contact with the first metal contact 127, the second contact layer 124 being in contact with the second metal contact 126, 126B.

The first metal contact comprises a first metal layer 127 covering the second and third contact layers 124, 123 and the second lateral extension element 135, 136.

The second metal contact 126, 126B comprises a second metal layer 126, and a third metal layer 126B. The second metal layer 126 is in contact with the first contact layer 125 and with the first thermal insulation arm 310 and the first conduction track 311 it includes. The third metal layer 126B covers the fourth insulating layer 133 on a face of the opposite to the first semiconductor layer. The third metal layer forms the absorbing element 128 of the structure 10.

The first, second and third metal layers 127, 126, 126B may be made of titanium nitride TiN.

According to the teaching of document WO2018055276 A1 and taking the configuration of the absorbing element 128 into account, so as to promote absorbing capabilities of the absorbing element 128, the third metal layer 126B and the third insulator layer 133 which supports it are chosen so as to meet the following inequalities:

$$150\ \Omega \le \frac{\rho}{Ep} \le 700\ \Omega$$

where ρ the equivalent resistivity of the first conductive layer 121 and the third insulating layer 133 and Ep being the sum of the thicknesses of the first conductive layer 121 and the third insulator layer 133.*la*. It will be noted that, even more preferentially, ρ/Ep is chosen to be close, or even equal to 376.9Ω.

The third metal layer 126B is thus preferably made of titanium nitride TiN and preferentially includes a thickness of between 5 and 15 nm or even equal to 10 nm.

It will be noted that in the above configuration, the third insulator layer 133 has no or little influence on the equivalent impedance of the assembly, the third metal layer 126B and the third insulator layer 133, which explains the identical values for the thickness of the third metal layer 126B to that taught in document WO2018055276.

The first and second metal layers 127, 126 preferentially have a configuration similar to that of the third metal layer 126B and are therefore preferentially made of titanium nitride TiN and preferentially include a thickness of between 5 and 15 nm or even 10 nm.

The third metal layer 126B is covered with a first protective layer 141 adapted to protect the third metal layer during a selective attack, such as an attack with hydrofluoric acid HF in vapour phase, of a sacrificial material 431, 432, 431, such as silicon dioxide. Thus the first protective layer 141 can, for example, be a layer of alumina Al$_2$O$_3$, aluminium nitride AlN or hafnium dioxide HfO$_2$.

In the same way, the first, second metal layers 127, 126 and the fourth insulating layer 133 are covered with a second protective layer 142 adapted to protect the third metal layer during a selective attack, such as an attack with hydrofluoric acid HF in vapour phase, of a sacrificial material 431, 432, 431, such as silicon dioxide. Thus the second protective layer 142 can for example be a layer of alumina Al$_2$O$_3$, aluminium nitride AlN or hafnium dioxide HfO$_2$. Each of the first and second protective layers 143, 141 can have a thickness of between 10 and 50 nm and preferably 25 nm.

The second protective layer 142 has a first and second opening through which the first and second metal layers 127, 126 are in contact with the conduction tracks 317, 327 of the first and second insulation arms 310, 320 respectively.

The first insulation arm 310 comprises:
- a first vertical interconnect 314, a first end of which is in contact with the first metal layer 127,
- a first insulation tape 323 configured with an optimised length without overlapping the quarter-wave cavity, the first insulation tape 323 having a first end in contact with the first vertical interconnect 314 on a second end of the first vertical interconnect 314 that is opposite to the second end, a third electrical connection pad 312 in contact with the first insulation tape on a second end of the first tape and being adapted to allow bonding with a first electrical connection pad 311, the first electrical connection pad 311 bonded to the third electrical connection pad 312, for example by molecular bonding, a third metal contact 316 supporting the first electrical connection pad 311 opposite to the third electrical connection pad 312.

Identically, the second insulation arm 320 comprises:

a second vertical interconnect 324, a first end of which is in contact with the second metal layer 126, a second insulation tape 323 configured with an optimised length without overlapping the quarter-wave cavity, the second insulation tape 323 having a first end in contact with the second vertical interconnect 324 on a second end of the second vertical interconnect 324 that is opposite to the second end, a fourth electrical connection pad 322 in contact with the second insulation tape on a second end of the second tape and being adapted to allow bonding with a second electrical connection pad 321, the second electrical connection pad 321 bonded to the fourth electrical connection pad 322, for example by molecular bonding, a fourth metal contact 326 supporting the second electrical connection pad 321 opposite to the fourth electrical connection pad 322.

As illustrated in FIG. 1, the first and second interconnects 314, 324 can each include a metal body made of, for example, tungsten W and a third protective layer covering the metal body, said third protective layer may be formed of a layer of titanium Ti and a layer of titanium nitride TiN.

The first and second insulation tapes 313, 323 extend along an insulation plane parallel to the absorption plane and have a shape so as to provide an optimised length in order to optimise thermal insulation of the transistor 100 from the substrate 201. Thus, for example, the first and second insulation tapes 313, 323 may each have a zigzag or spiral shape. The first and second insulation tapes each comprise: a metal centre track, for example, of titanium nitride TiN, and a passivation and protective coating, for example, formed by a stack of a layer of amorphous silicon aSi, a layer of hafnium dioxide $HfO_2$ and a layer of alumina $Al_2O_3$, or aluminium nitride AlN or silicon nitride SiN.

The third and fourth electrical connection pads 312, 322 each comprise a metal core and a barrier coating of, for example, titanium nitride TiN. The metal of each of the metal cores of the third and fourth electrical connection pads is adapted to enable bonding to the first and second metal pads respectively, the metal being preferentially copper Cu. The part of each of the third and fourth electrical connection pads 313, 323 by which said third and fourth electrical connection pads 313, 323 are bonded to the first and second electrical connection pads 312, 322, respectively, is free of barrier coating.

The first and second electrical connection pads 311, 321, in order to enable bonding, such as molecular bonding, are respectively formed of a metal preferentially identical to that of the metal core of the third and fourth electrical connection pads 312, 322. Thus, the first and second electrical connection pads 311, 321 are preferentially of copper Cu.

The third and fourth metal contacts 316, 326 are adapted to form an ohmic contact with the first and second contact zones 315, 325, respectively. Thus, the third and fourth metal contact 316, 326 can be made of a metal material selected from aluminium Al, copper Cu, gold Au, titanium Ti, platinum Pt, nickel and alloys thereof, including especially aluminium copper alloy AlCu. The thickness of the third and fourth metal contacts 316, 326 can be between 100 nm and 1 μm and preferentially substantially equal to 300 nm.

The third metal contact 316, the first electrical connection pad 311, the metal core of the third contact pad 312, the metal centre track of the insulation tape 313, and the metal body of the first vertical interconnect 314 together form the first conduction track 317.

Similarly, the fourth metal contact 326, the second electrical connection pad 321, the metal core of the fourth contact pad 322, the metal centre track of the second insulation tape 323, and the metal body of the second vertical interconnect 324 together form the second conduction track 327.

The first and second conduction tracks 317, 327 enable the first and second contact zones 315, 325 of the readout circuit 340 to be connected with the MOS transistor 100.

Thus, the substrate 341 comprises the readout circuit 340 and has a first and second readout circuit contact zone 315, 325 and a reflection surface 330 arranged to for, together with the absorbing element 128 formed by the third conduction layer 126B, the quarter-wave cavity adapted to the wavelength range of the radiation detected by the detection structure 10. The reflection surface 330 has a similar configuration to that of the third and fourth metal contacts and is preferentially formed of a material selected from the group including aluminium Al, copper Cu, gold Au, titanium Ti, platinum Pt, nickel Ni and alloys thereof, including especially the copper aluminium alloy. The reflection surface 330 has a thickness of between 100 nm and 1 μm, being preferentially equal to 300 nm. It will be noted that the substrate 410 also has a fourth insulating layer 345 covering a first face of the substrate and interposed between the substrate and the third insulating layer.

In the same way as the third metal layer 126B, due to the preferred manufacturing method of the invention, in this first embodiment, the reflection surface 330 is coated, on its face which is opposite to the substrate, with a fourth protective layer 351, such as a layer of aluminium nitride AlN, hafnium dioxide $HfO_2$ or sapphire $Al_2O_3$, capable of protecting the reflection surface during an acid attack, such as an attack with hydrofluoric acid HF. The fourth protective layer 351 has a thickness of between 10 and 200 nm, or even between 20 and 150 nm, and preferentially equal to 100 nm.

Figure 3A:
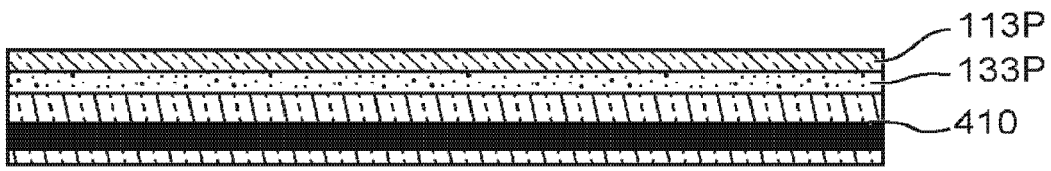
Figure 3B:
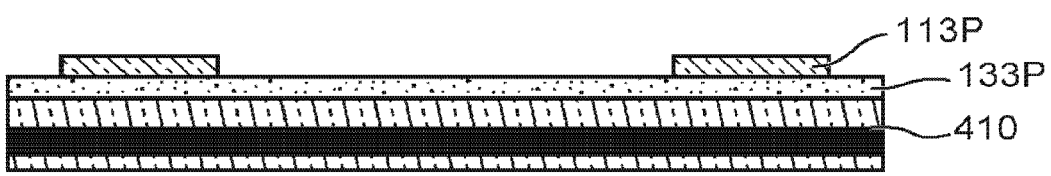
Figure 3C:
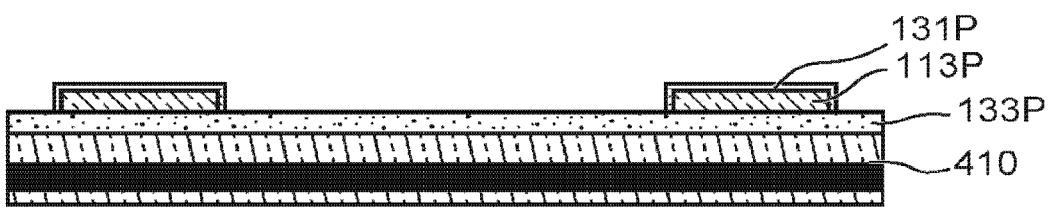
Figure 3D:
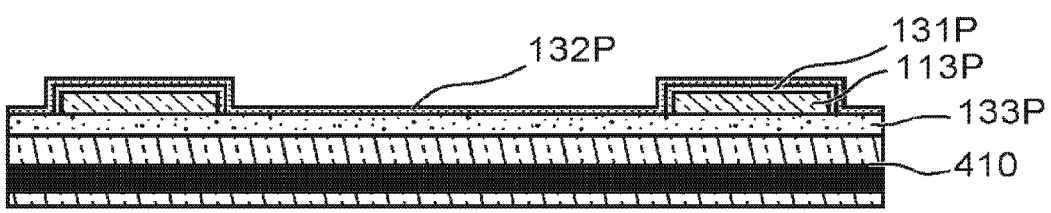
Figure 3E:
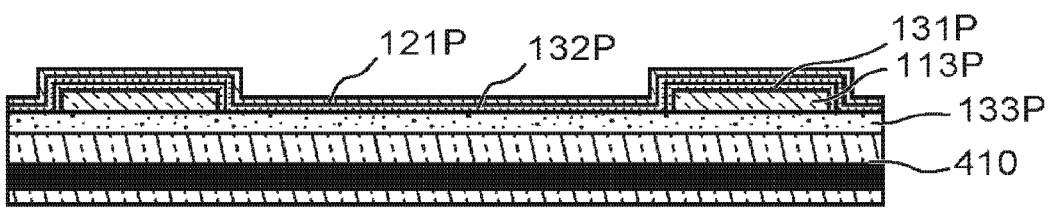
Figure 3F:
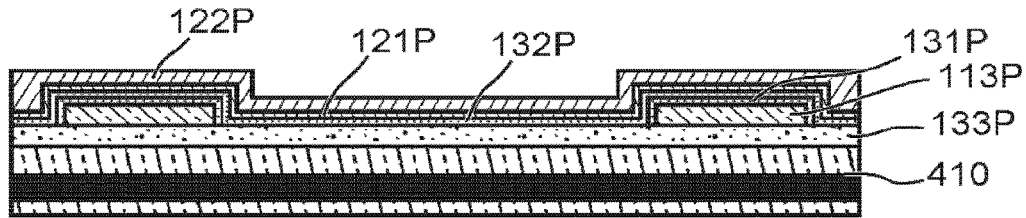
Figure 3G:
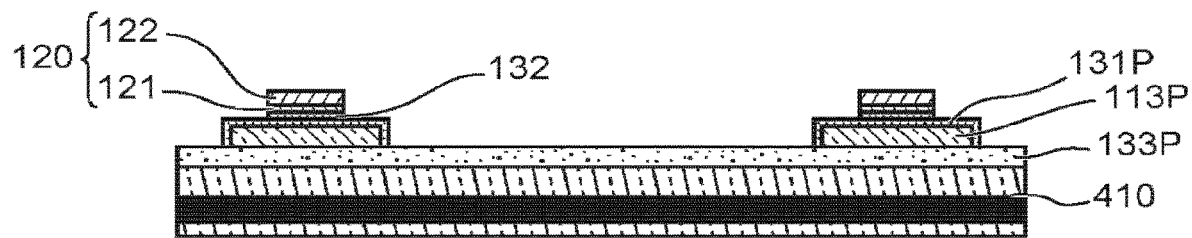
Figure 3H:
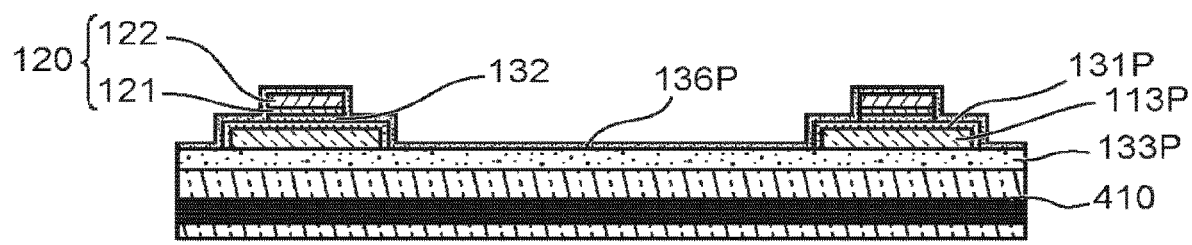
Figure 3I:
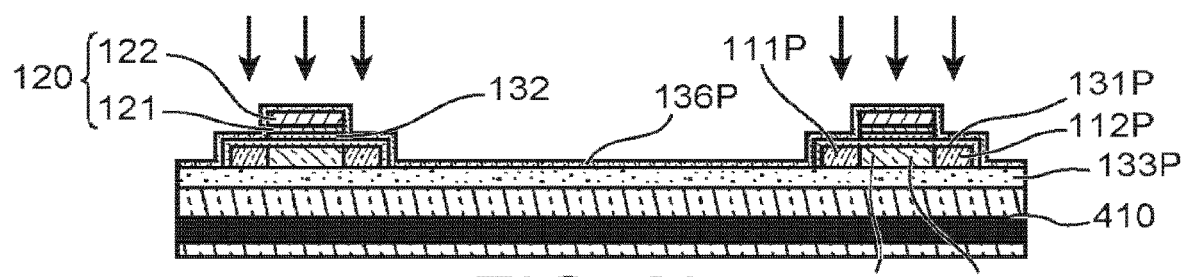
Figure 3J:
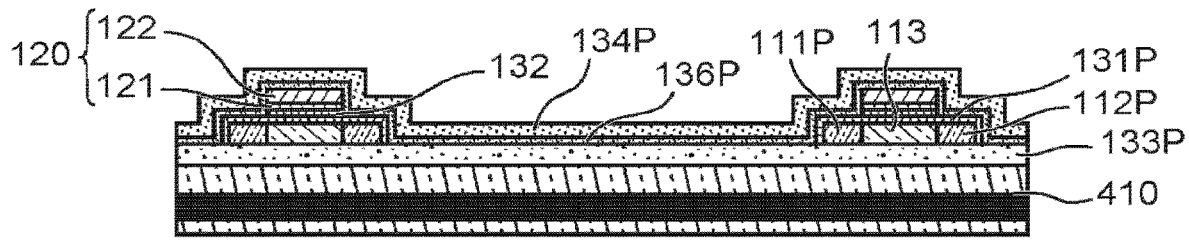
Figure 3K:
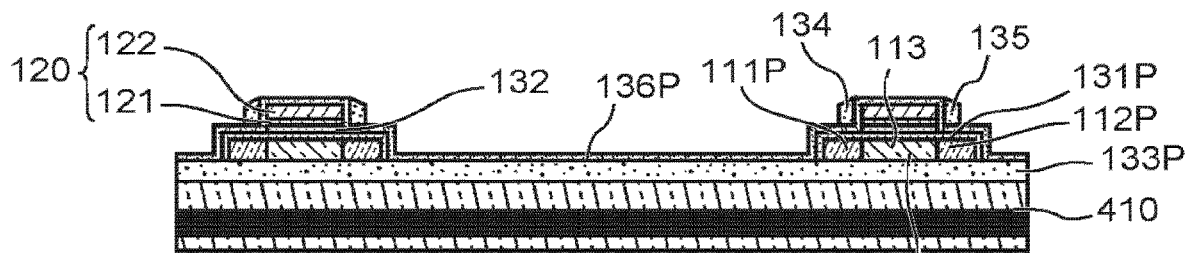
Figure 3L:
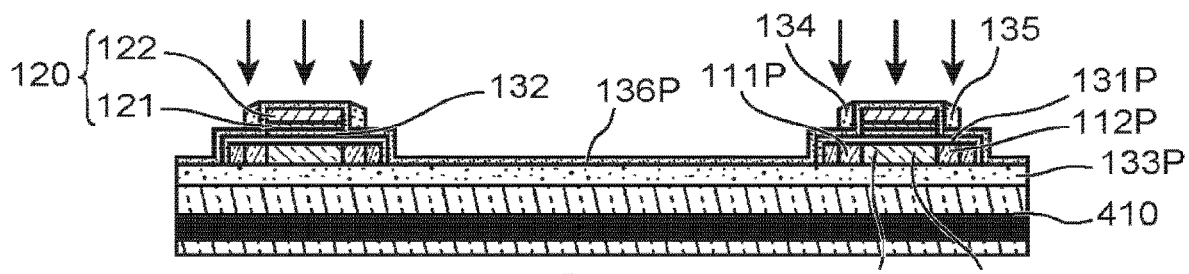
Figure 3M:
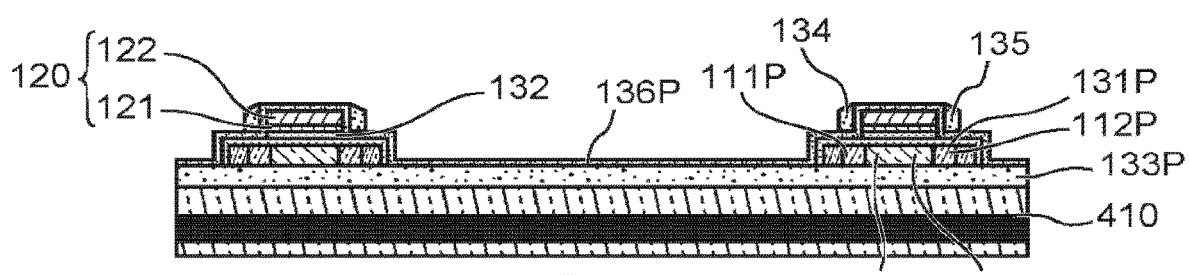
Figure 3N:
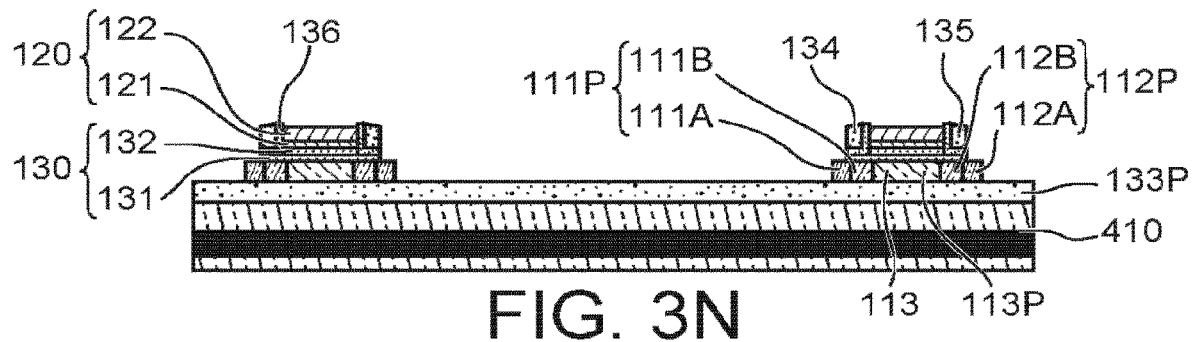
Figure 3O:
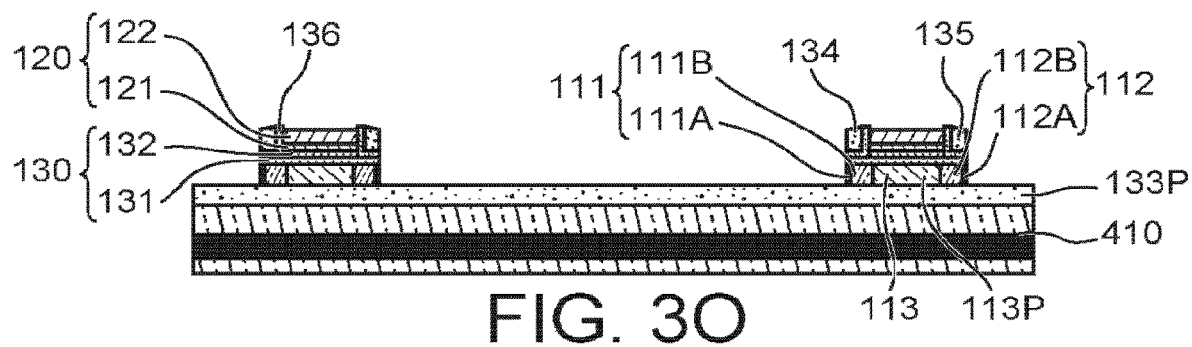
Figure 3P:
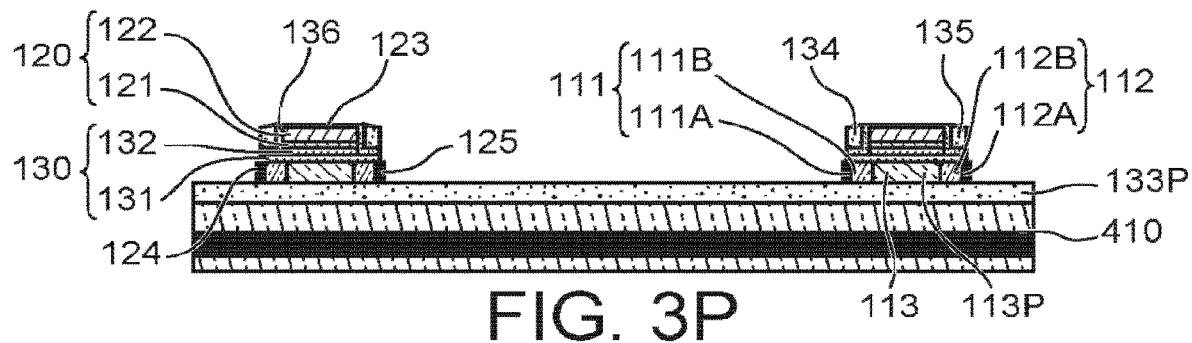
Figure 3Q:
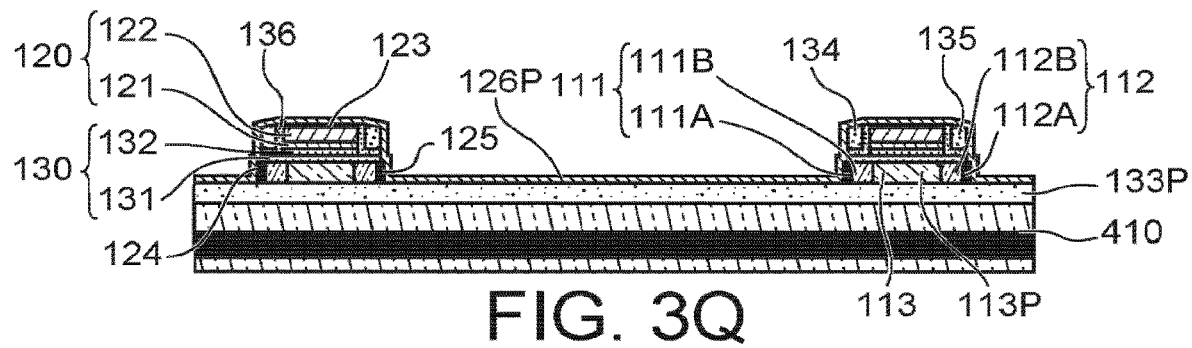
Figure 3R:
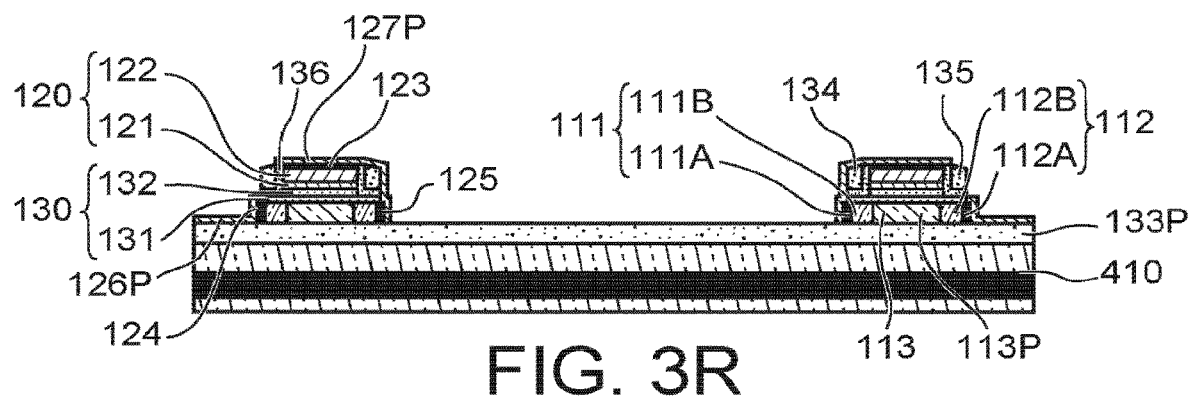
Figure 3S:
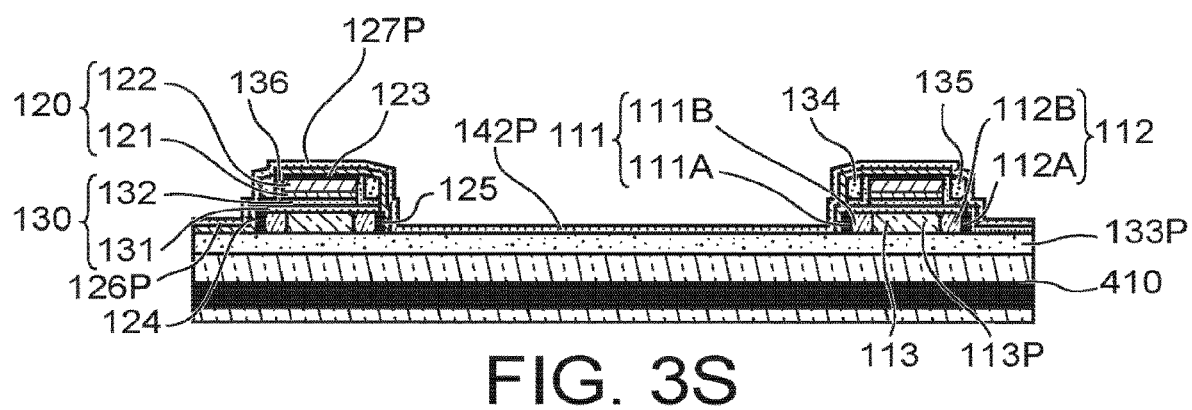
Figure 3T:
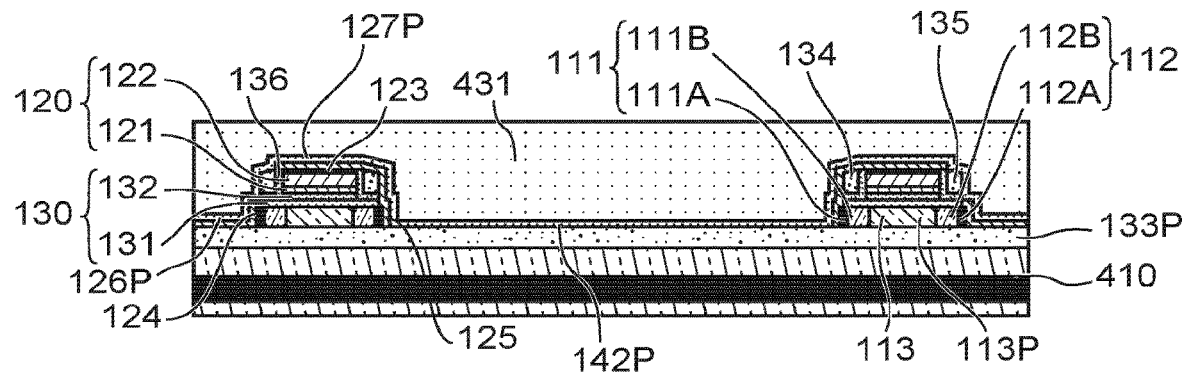
Figure 3U:
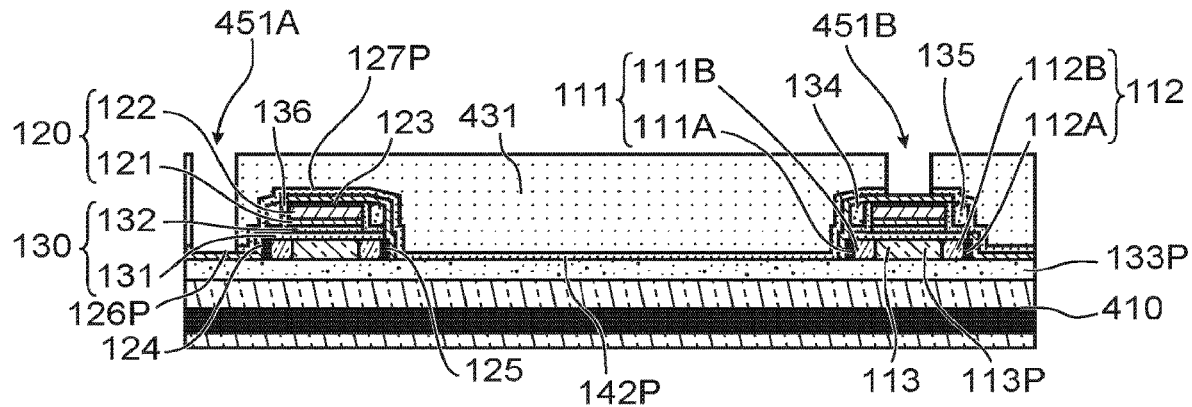
Figure 3V:
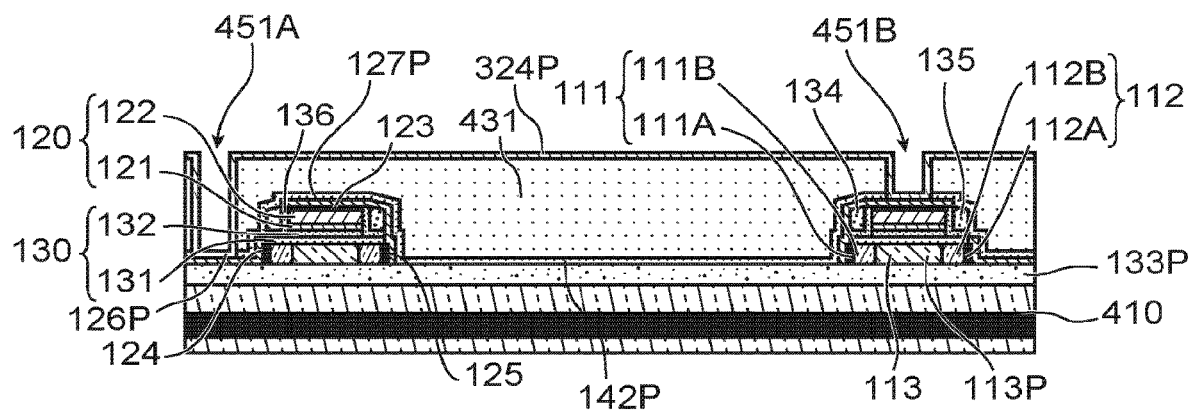
Figure 3W:
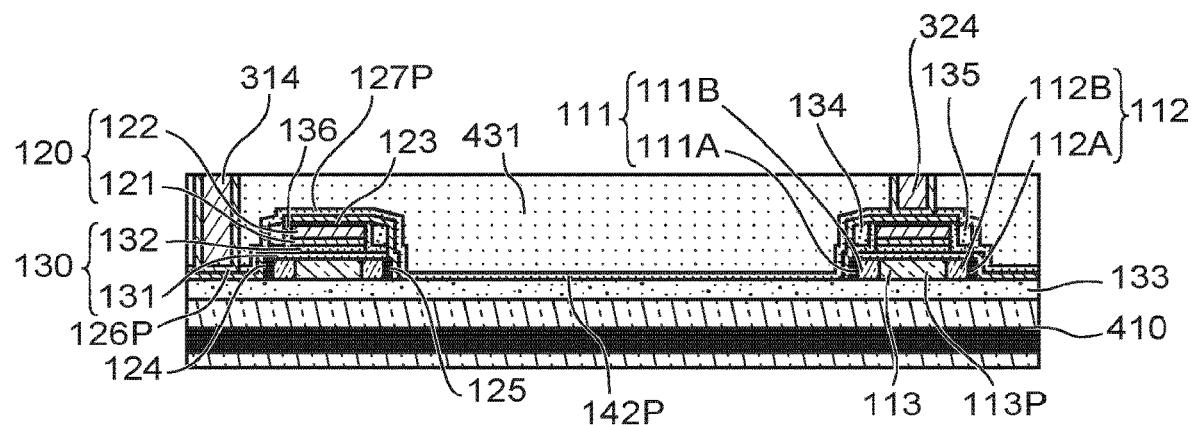
Figure 3X:
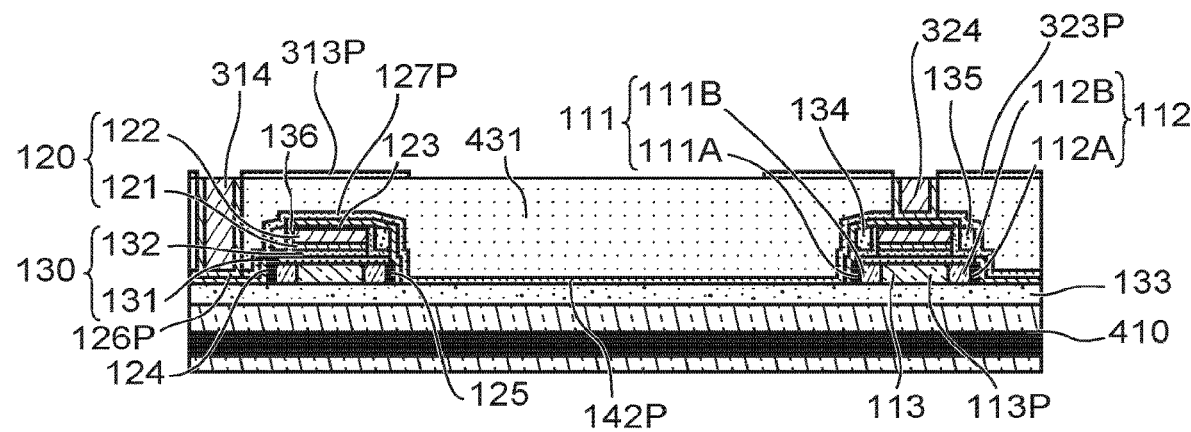
Figure 3Y:
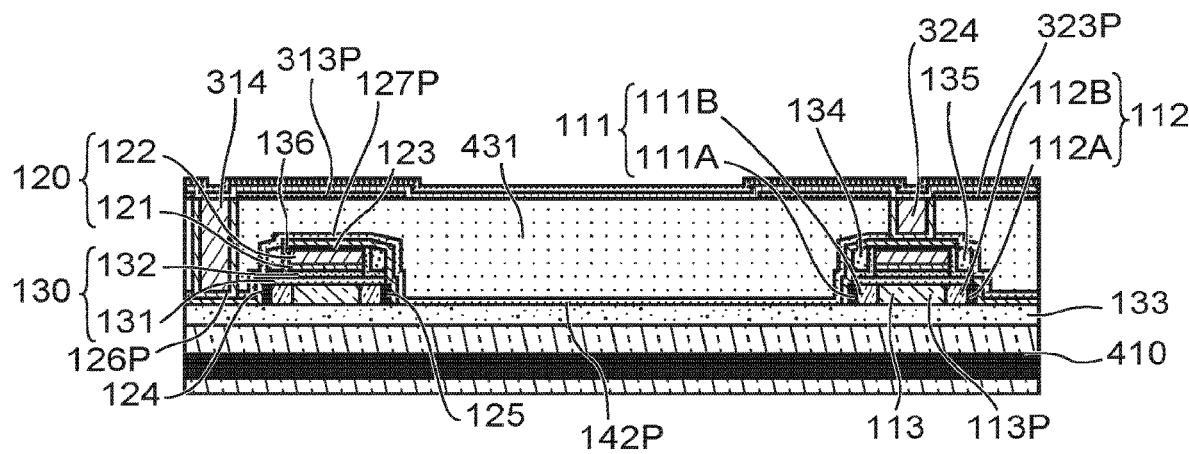
Figure 3Z:
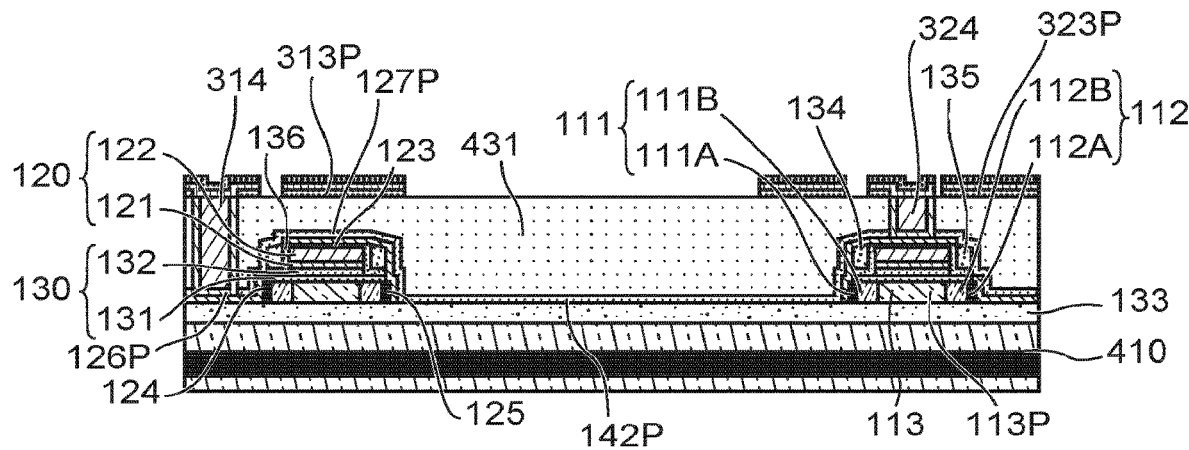
Figure 3Z:
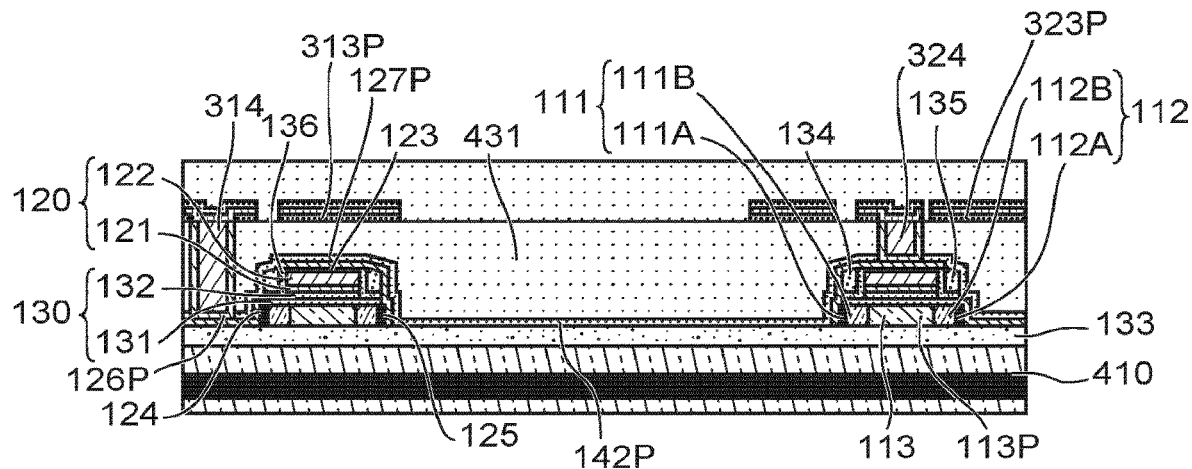
Figure 3Z:
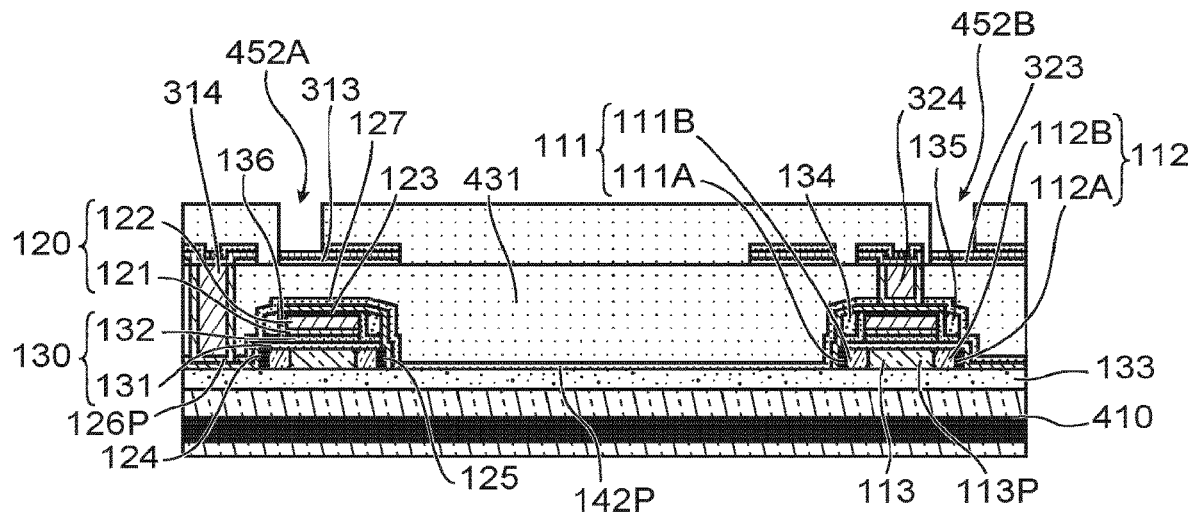
Figure 3Z:
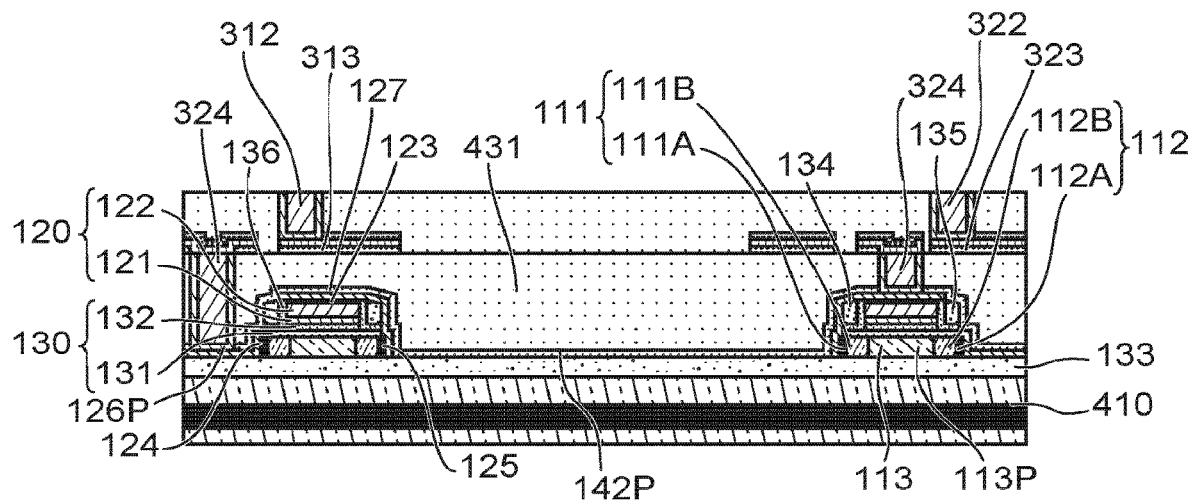

Such a detection structure 10 can be manufactured by means of a manufacturing method having three different phases:

a first phase of manufacturing the main parts of the transistor 100, the steps corresponding to this first phase being illustrated in FIGS. 3A to 3ZC, a second phase of manufacturing the substrate including the readout circuit 340, the steps corresponding to the second phase being illustrated in FIGS. 4A to 4F, a third phase of assembling the substrate 341 comprising the readout circuit and the transistor 100 and finalising the detection structure 10, the steps corresponding to the third phase being illustrated in FIGS. 4G to 4N.

Thus, as illustrated in FIGS. 3A-L, the first phase of the manufacturing method comprises the following steps of:

providing a first substrate 410 comprising a semiconductor on insulator layer, said semiconductor layer forming the first semiconductor layer 113P according to the invention and the insulator being formed by a fourth insulating layer 133P, such as a silicon-on-insulator substrate known as SOI, as illustrated in FIG. 3A, locally etching the first semiconductor layer 113P so as to keep only the parts of the first semiconductor layer 113P for forming the first, third and fourth zones 111, 113, 112, as illustrated in FIG. 3B, partially oxidising the first semiconductor layer 113P to form the first insulating layer 131P of silicon dioxide in contact with said first semiconductor layer 113P, as illustrated in FIG. 3C, depositing a dielectric material having a higher dielectric constant than silicon dioxide $SiO_2$ in contact with the first insulating layer 131P and the fourth insulating layer 133P so as to form the second insulating layer 132P, as illustrated in FIG. 3D, depositing a first conductive material onto the surface of the second insulating layer 132P to form a first conductive layer 121P, the first conductive layer 121P, said first conductive material being for the present embodiment titanium nitride TiN with a thickness between 5 and 15 nm, preferably equal to 10 nm, as illustrated in FIG. 3E, depositing a second conductive material in contact with the first conductive layer 122P so as to form the masking layer 122P, said second conductive material being for the present embodiment polycrystalline silicon pSi deposited by chemical vapour deposition with a thickness of between 10 and 150 nm, preferably between 20 and 100 nm and advantageously substantially equal to 50 nm, said masking layer 122P forming a masking layer, as illustrated in FIG. 3F, locally etching the second and first conductive layers 122P, 121P and the second insulating layer 132P in order to form a masking layer/first conductive layer assembly, the first conductive layer and the masking layer forming the gate electrode 120 of the MOS transistor 100, as illustrated in FIG. 3G, depositing a first pre-implantation layer 136P made of silicon dioxide $SiO_2$ in contact with the exposed surfaces of the fourth insulating layer 133P, the first insulating layer 131P, the second insulating layer 132, and the first conductive layer 121 and the masking layer 122, said first pre-implantation layer 136P forming the third insulating layer, as illustrated in FIG. 3H, firstly implanting doping elements of the semiconductor layer 113P, a first part of the semiconductor layer 113P being protected by the masking layer/first conductive layer assembly, and said implantation being performed with a first dose adapted to provide the second concentration of majority carriers higher than the first concentration, said doping elements being capable of providing majority carriers of the second conductivity type opposite to the first conductivity type, as illustrated in FIG. 3I, depositing a layer of dielectric material 134P in contact with the third insulating layer 136P, said dielectric material being preferentially selected from silicon dioxide $SiO_2$ and silicon nitride $Si_3N_4$, said layer being capable of having a thickness between 20 and 500 nm, preferably between 30 and 200 nm, as illustrated in FIG. 3J, physically anisotropically etching the dielectric material layer 134P, such as reactive ion etching or plasma etching, so as to retain only those parts of the dielectric layer that are facing the flanks of the stack formed by the second insulating layer 132, the first conductive layer 121 and the masking layer 122, the remaining parts of the dielectric material layer 134P forming the first and second lateral extension portions 134, 135, this etching allowing the formation of the first and second lateral extension elements 134, 135, 136 made of the dielectric materials of the fourth insulating layer 136 and of the first and second lateral extension portions 134, 136 in contact with the first insulating layer 131P on either side of the first conductive layer 121/masking layer 122 assembly, said first and second lateral extension elements 134, 135, 136 extending from the first conductive layer 121/masking layer 122 assembly, as illustrated in FIG. 3K, secondly implanting doping elements in the first semiconductor layer 113P, a second part of the first semiconductor layer 113P, comprising the first part of the first semiconductor layer 113P, being protected by the first conductive layer 121/masking layer 122 assembly and the first and second lateral extension elements 134, 135, 136 extending therefrom, said second implantation being performed with a second dose higher than the first dose and being adapted to provide a third concentration of majority carriers higher than the second concentration, said doping elements being capable of providing majority carriers of the second conductivity type, as illustrated in FIG. 3L, thermally annealing the first substrate 410 with especially the first semiconductor layer 113P, the thermal annealing being capable of diffusing and activating the doping elements implanted during the first and second implantations, so as to form the first and second zones 111P, 112P of the transistor with, for each of the first and second zones 111P, 112P, a first region having a concentration of majority carriers strictly higher than the second concentration and a second region having a concentration of majority carriers equal to or lower than the second concentration, said first region being respectively partly covered with the first and second lateral extension elements 134, 135, 136, said first and second zones 111P, 112P being separated from each other by a third zone 113 of the MOS transistor 100 covered with the first insulating layer 131P, the thermal annealing can be, for example, an annealing at a temperature between 950° C. and 1050° C. for a duration of between 1 and 20 s, as illustrated in FIG. 3M, locally etching, for example by selective etching of silicon dioxide $SiO_2$ with respect to silicon Si and silicon nitride SiN, such as chemical etching adapted to selectively etch silicon dioxide $SiO_2$, exposed portions of the fourth insulating layer 136, as illustrated in FIG. 3N, locally etching, for example by means of selective etching of silicon dioxide $SiO_2$ with respect to silicon nitride SiN, the parts of the first semiconductor layer 113P not protected by the first conductive layer 121/masking layer 122 assembly and first and second lateral extension elements 134, 135, 136, said selective etching allowing to retain only the parts of the first regions 111A, 112A of each of the first and second zones 111, 112 protected by the first and second lateral extensions 134, 135, 136 and, if applicable, by the masking layer/first conductive layer assembly, the first and second zones 111, 112 of the MOS transistor 100 being thus formed with, for each of them, the formation of the first and second regions 111A, 112A, 111B, 112B, whereby one end of each of the first and second lateral extension elements 134, 135, 136 is aligned with a respective flank of the semiconductor layer 113P in a direction perpendicular to a plane of the semiconductor layer 113P, as illustrated in FIG. 3O, siliciding the first and second zones 111, 112 at the flanks of the first semiconductor layer and the surface of the masking layer 122 to form the first, second and third contact layers 125, 124, 123, respectively, the siliciding being provided, for example, by successively depositing nickel Ni and a titanium nitride TiN followed by annealing at 300 to 350° C. and selective etching adapted to etch the unreacted nickel Ni and titanium nitride TiN, said siliciding being alternatively adaptable to form each of the first, second and third contact layers 125, 124, 123 of a silicide preferentially selected from nickel silicide NiSi, titanium silicide TiSi, cobalt silicide CoSi and platinum silicide PtSi, as illustrated in FIG. 3P, depositing a metal layer 126P in contact with the third insulating layer 133P and the first, second and third contact layers 125, 124, 123, said metal layer 126P being for forming the first and second metal layers 127, 126, said metal layer 126P being preferentially made of titanium nitride TiN and preferentially having a thickness of between 5 and 15 nm or even equal to 10 nm, as illustrated in FIG. 3Q, locally etching the metal layer 126P so as to form the first metal layer 127P in contact with the first and third contact layers 124, 123 and the second contact layer 126P in contact with the first contact layer 125, the third insulating layer 133P being released from the metal layer 126P, as illustrated in FIG. 3R, depositing the second protective layer 142 in contact with the first and second metal layers 127P, 126P and the third insulating layer 133P, the second protective layer can be a layer of alumina $Al_2O_3$, aluminium nitride AlN or hafnium dioxide $HfO_2$, with a thickness of between 10 and 50 nm and preferentially equal to 25 nm, as illustrated in FIG. 3S, depositing a first layer of sacrificial material 431, such as a layer of silicon dioxide $SiO_2$, in contact with the second protective layer 142 and planarising said first layer of sacrificial material 431 to remove the excess of sacrificial material so as to encapsulate the first, second and third zones/first and second insulating layers/first conductive layer/masking layer/second protective layer assembly, as illustrated in FIG. 3T, locally etching the first layer of sacrificial material 431 to form two apertures 451A, 451B opening onto the first and second metal layers 127, 126B respectively, as illustrated in FIG. 3U, depositing a third protective layer 324P in contact with the first layer of sacrificial material 431 and the walls of the two apertures 451A, 451B made in the first layer of sacrificial material 431 and especially in contact with the first and second metal layers 127, 126, said third protective layer 324P comprising an underlayer of titanium Ti and an underlayer of titanium nitride TiN, as illustrated in FIG. 3V, depositing the material forming the metal body of the vertical interconnects 314, 324 so as to fill the two apertures 451A, 451B made in the first layer of sacrificial material 431 and to form the first and second vertical interconnects, as illustrated in FIG. 3W, locally depositing a first part of the passivation and protective coating of the first and second insulation tapes 313, 323 in contact with the first layer of sacrificial material 431, said first part of the passivation and protective coating can comprise an underlayer of amorphous silicon aSi, an underlayer of hafnium dioxide $HfO_2$ and an underlayer of alumina $Al_2O_3$ as illustrated in FIG. 3X, depositing a metal layer for forming the metal centre track of the first and second insulation tapes 313, 323 and the first layer of sacrificial material 431, depositing, in contact with said metal layer, a layer for forming the second part of the passivation and protective coating of the first and second insulation tapes 313, 323, as illustrated in FIG. 3Y, removing the portions of said metal layer and said layer for forming the second part of the passivation and protective coating of the first and second insulation tapes 313, 323 so as to form the first and second insulation tapes 313, 312, as illustrated in FIG. 3Z, depositing a second layer of sacrificial material 432, such as a layer of silicon dioxide $SiO_2$, in contact with the first and second insulation tapes 313, 323 and the first layer of sacrificial material 432 so as to encapsulate the first and second insulation tapes 313, 323, as illustrated in FIG. 3ZA, locally etching the second layer of sacrificial material 432 to form two apertures 452A, 452B opening onto the first and second insulation tapes 313, 323 respectively, as illustrated in FIG. 3ZB, depositing a layer for forming the barrier coating of the third and fourth electrical connection pads 312, 322 in contact with the second layer of sacrificial material 432 and the walls of the two apertures 452A, 452B provided therein, said layer for forming the barrier coating being able to be formed by depositing titanium nitride TiN and depositing the material for forming the metal core of the third and fourth electrical connection pads 312, 322 so as to fill the two apertures 452A, 452B made in the second layer of sacrificial material 432 and form the third and fourth electrical connection pads 312, 322, as illustrated in FIG. 3ZC.

This first phase of the method allows forming a first assembly comprising the first substrate, the transistor 100 and a first part of the first and second isolation arms 310, 320.

Figure 4A:
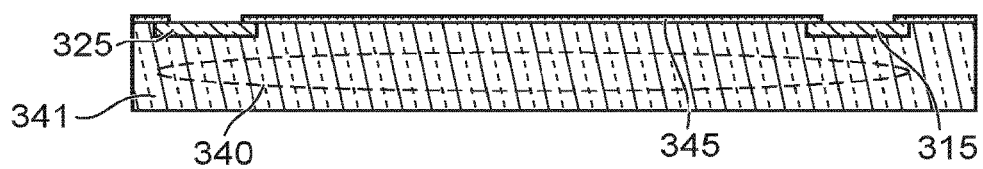
Figure 4B:
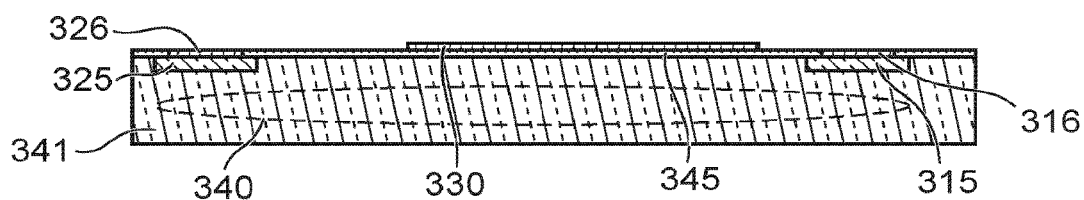
Figure 4C:
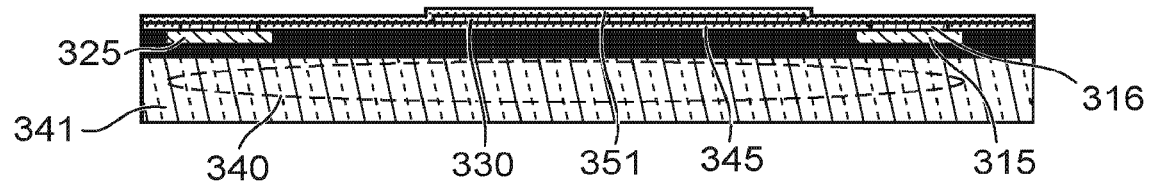
Figure 4D:
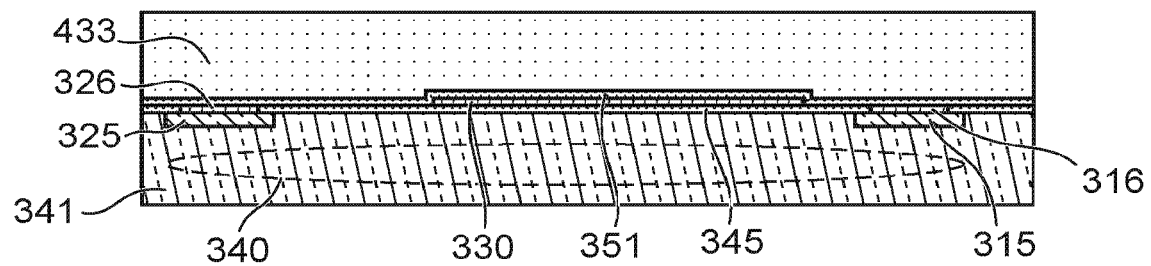
Figure 4E:
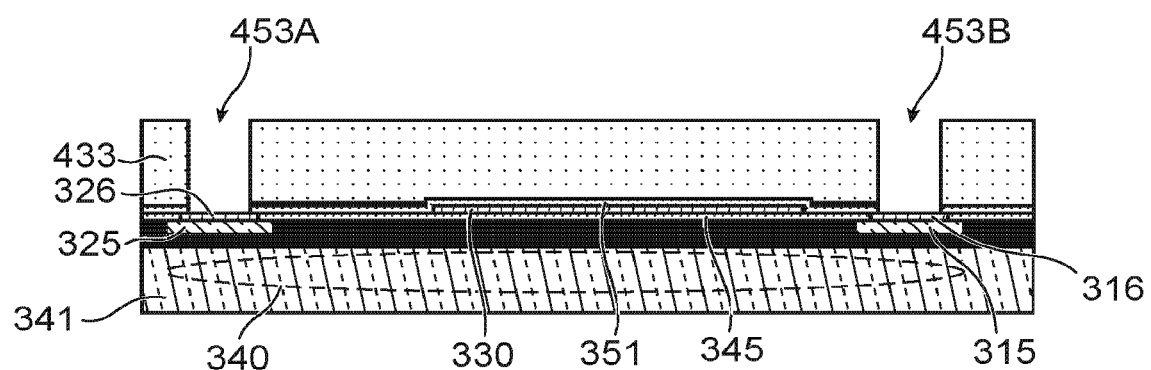
Figure 4F:
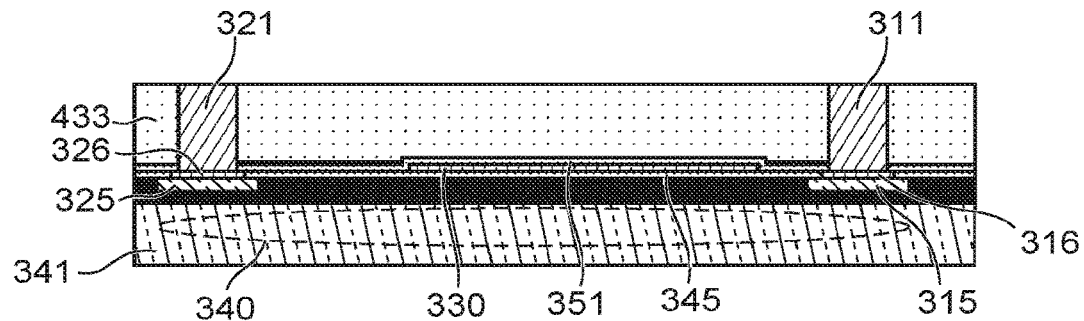
Figure 4G:
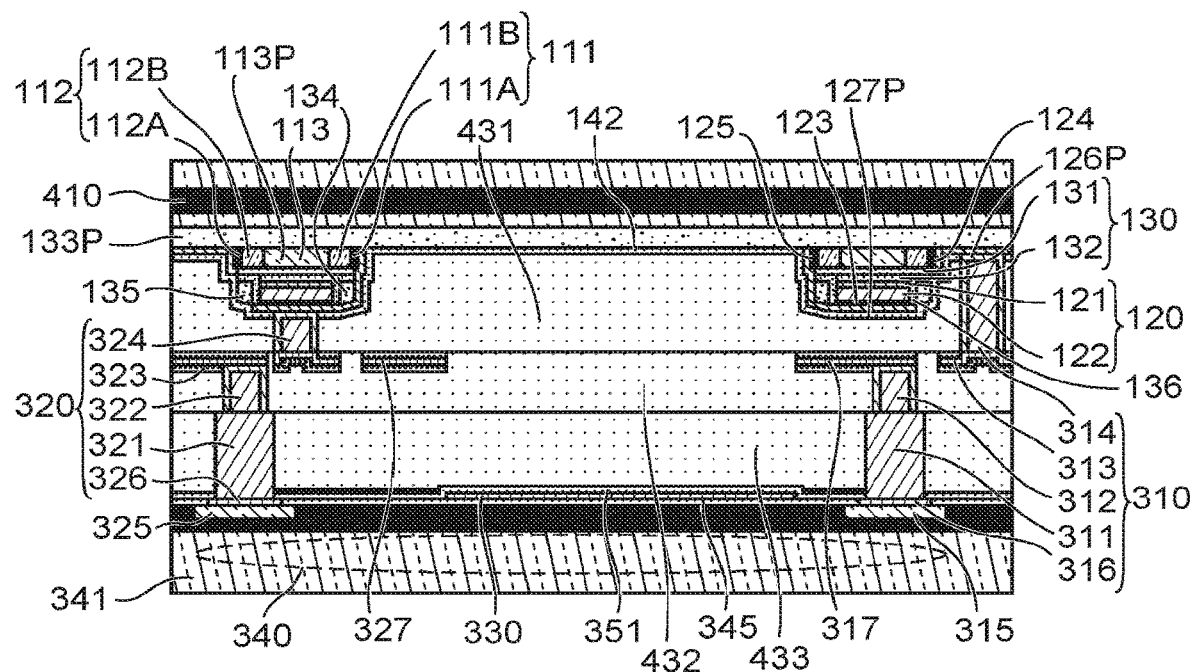
Figure 4H:
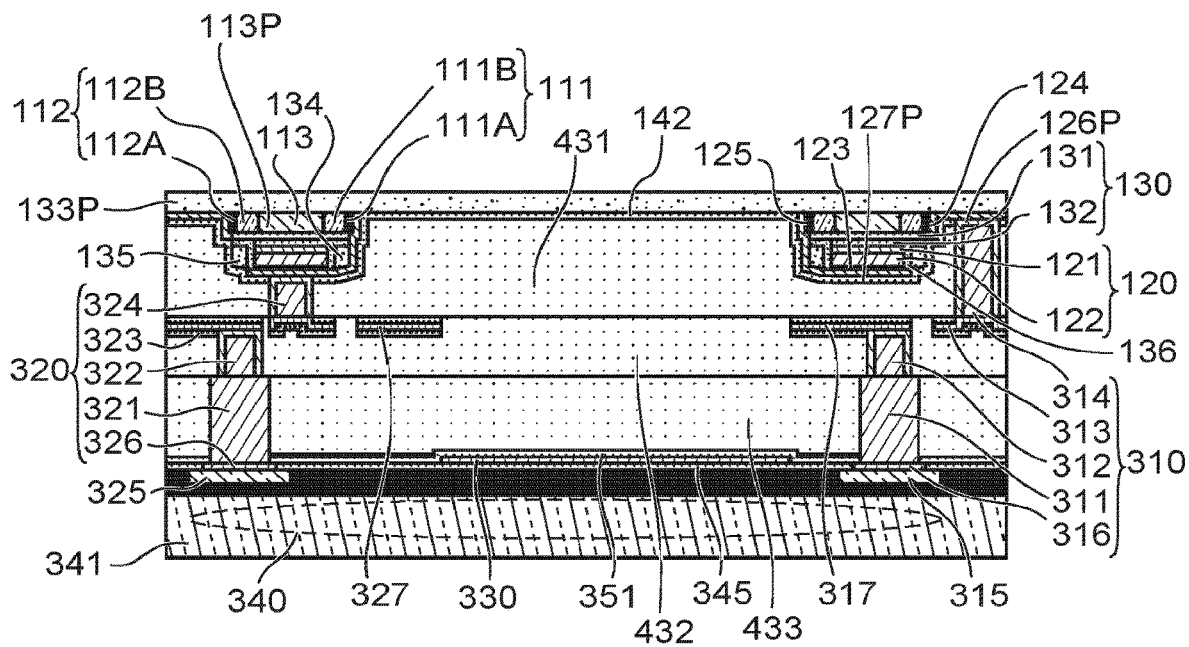
Figure 4I:
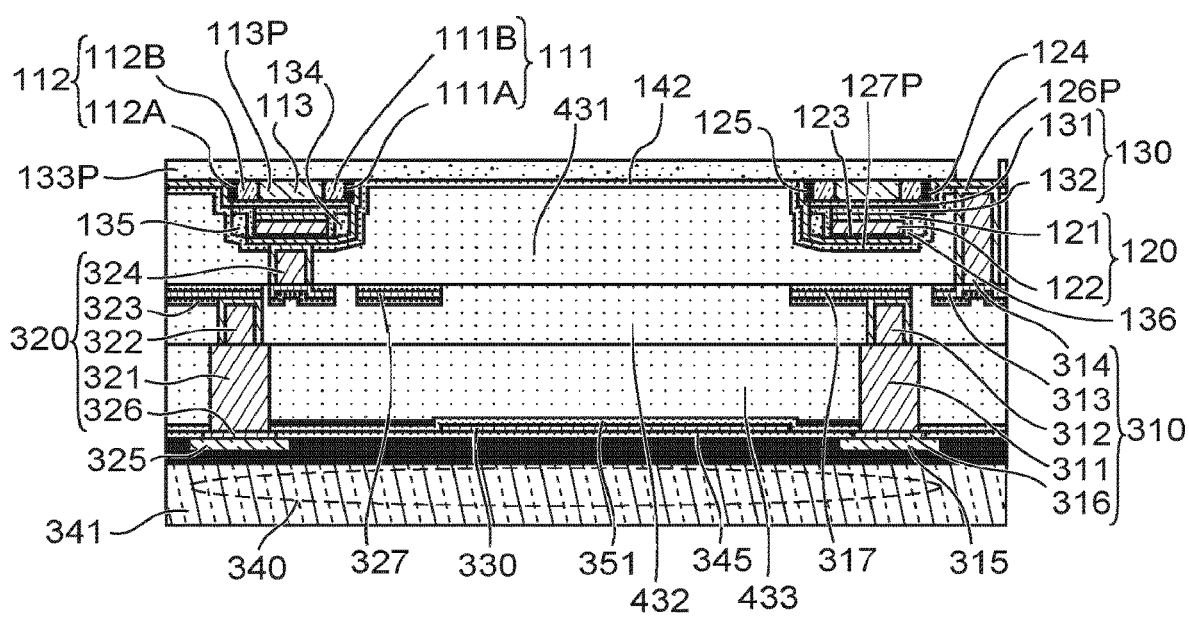
Figure 4J:
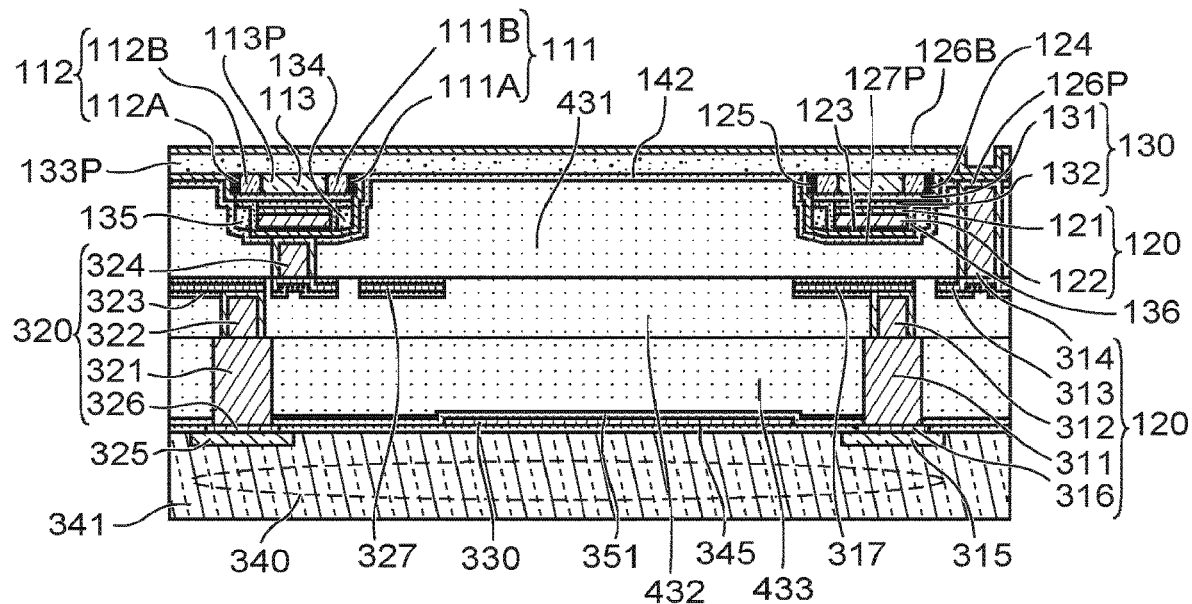
Figure 4K:
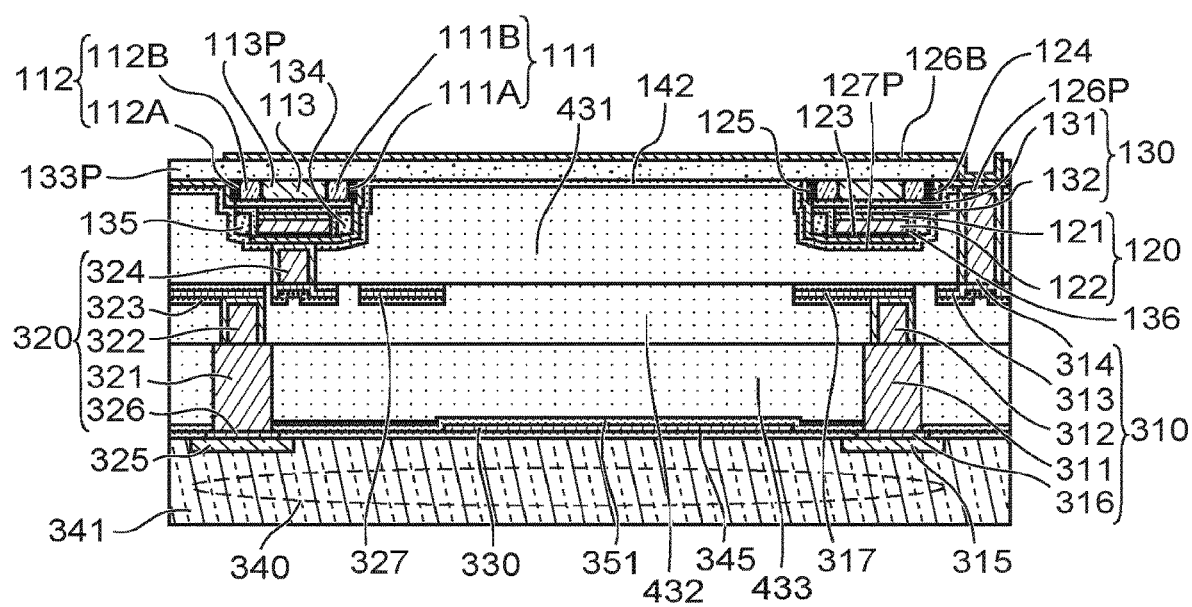
Figure 4L:
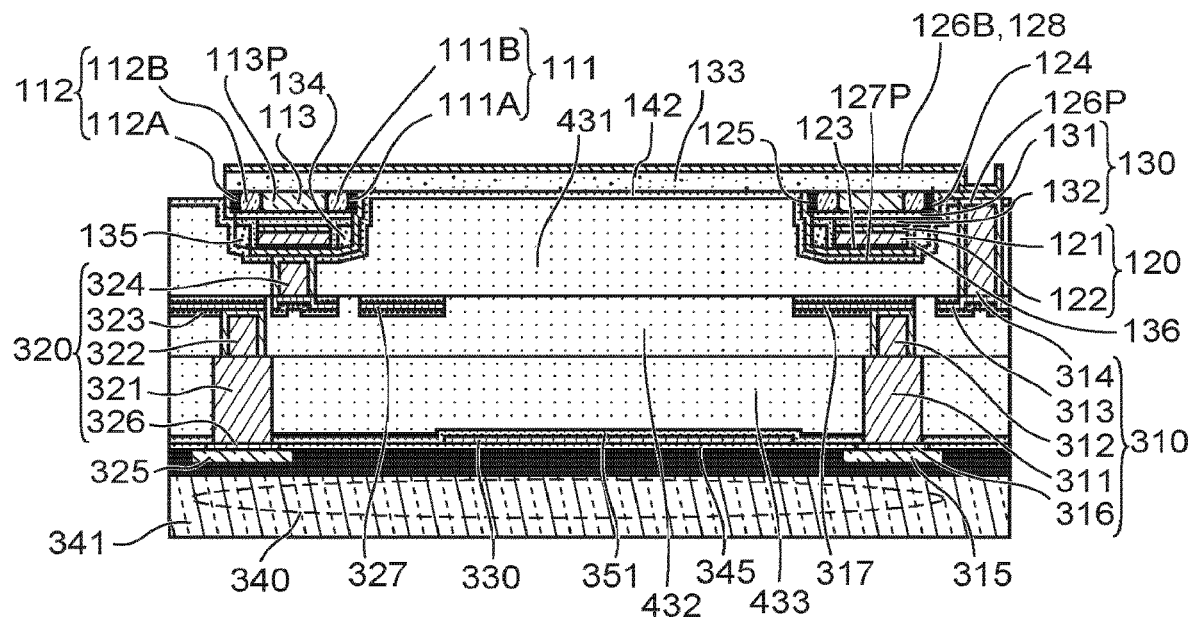
Figure 4M:
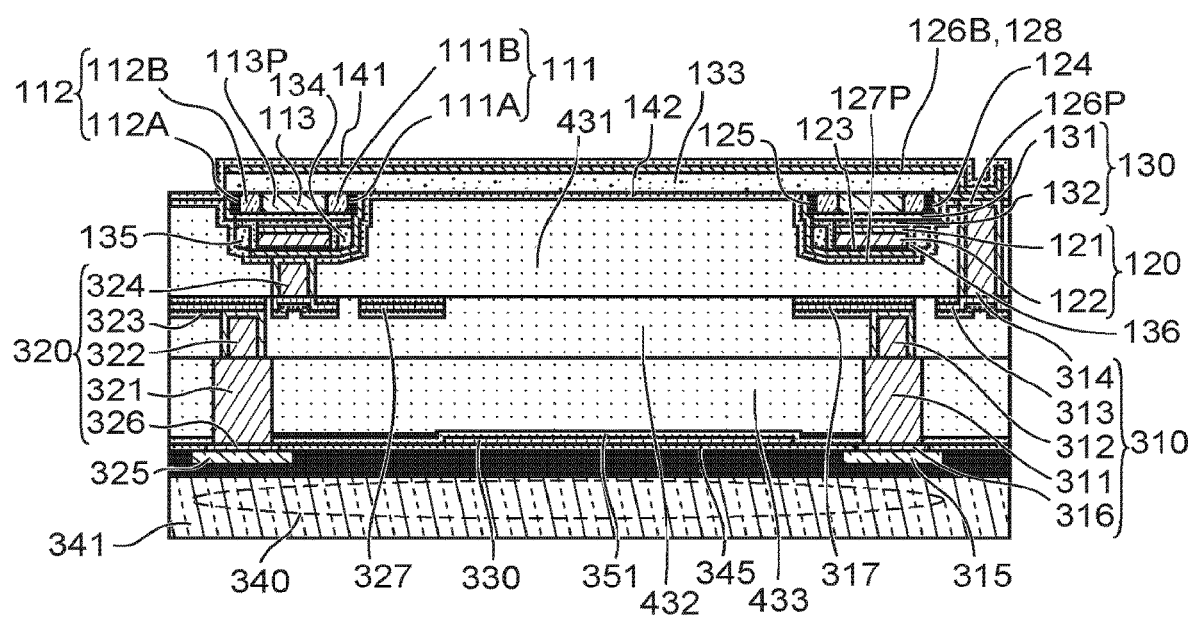
Figure 4N:
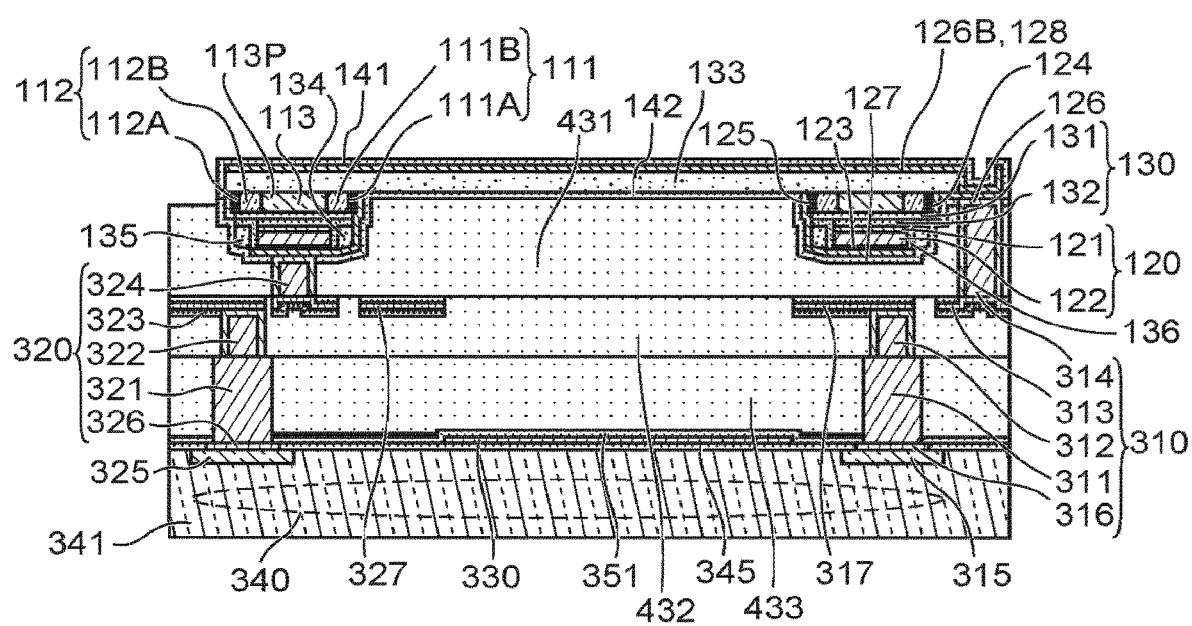

The second phase of the manufacturing method according to the invention can be implemented before, concomitantly with, or after the first phase described above. The second phase comprises the following steps of:

providing a second substrate 341, the second substrate 341 comprising a readout circuit 340 and, on a first surface of the second substrate 341 having a first and a second contact 325, 321 of the readout circuit for connecting to the gate electrode/first zone 111 and the second zone 112, respectively, and a fourth insulating layer 345, preferentially of silicon dioxide $SiO_2$, coating the part of the first surface of the second substrate 340 outside the first and second contacts 325, 315 of the readout circuit 341, said fourth insulating layer also covering the periphery of the first and second contacts 325, 315 of the readout circuit 341, as illustrated in FIG. 4A, locally depositing a reflective and conductive material in contact with the first and second contact zones 325, 315 and on a part of the fourth insulating layer 345 to form a third and fourth metal contact 326, 316 and the reflection surface 330, the reflective and conductive material in this embodiment of the invention being selected from the group including aluminium Al, copper Cu, gold Au, titanium Ti, platinum Pt, nickel Ni and alloys thereof, including especially copper-aluminium alloy, with a thickness of between 100 nm and 1 µm, the latter preferentially being equal to 300 nm, as illustrated in FIG. 4B, depositing a fourth protective layer 351 onto the first substrate 340 in contact with the reflection surface 330, the third and fourth metal contacts 326, 316 and the part of the fourth insulating layer 345 which is free of reflective and conductive material, the fourth protective layer 351 being preferentially chosen from a layer of aluminium nitride AlN, hafnium dioxide $HfO_2$ or sapphire $Al_2O_3$, capable of protecting said layers during an acid attack such as an attack with hydrofluoric acid HF, said fourth protective layer 351 having a thickness of between 10 and 50 nm and preferentially equal to 25 nm, as illustrated in FIG. 4C, depositing a third layer of sacrificial material 433, such as a layer of silicon dioxide $SiO_2$, in contact with the fourth protective layer 351 and a step of planarising said sacrificial material to remove excess second sacrificial material and to provide a layer of the second sacrificial material of between 1.3 and 2.5 µm, as illustrated in FIG. 4D, forming two apertures 453A, 453B by locally etching the third layer of sacrificial material 433 and the fourth protective layer 451, said apertures 453A, 453B opening onto the third and fourth metal contacts 326, 316, as illustrated in FIG. 4E, filling the apertures 452A, 452B with a metal material to form the first and second electrical connection pads, a second assembly to be assembled comprising the second substrate 340, the reflective and conductive material, the second sacrificial material 432 and the second parts 310P, 320P of the first and second thermal insulation arms 310, 320, being thus formed, as illustrated in FIG. 4F, bonding the first and second assemblies through their faces comprising the first and second sacrificial materials 431, 432, respectively, as illustrated in FIG. 4G, removing the first substrate 410, as illustrated in FIG. 4H, locally etching the third insulating layer 133 to form an aperture 454 opening onto the second metal layer 126, as illustrated in FIG. 4I, depositing the third metal layer 126B in contact with the third insulating layer 133 and the walls of the aperture provided therein, said third metal layer 126B being in contact with the second metal layer 126 through the aperture provided in the third insulating layer, as illustrated in FIG. 4J, locally etching the third metal layer 126B so as to delimit it laterally, as illustrated in FIG. 4K, etching the parts of the third insulating layer 133 and the first and second metal layers 127, 126, 126B which are not covered with the third metal layer 126B, whereby the parts of the second protective layer 142 which are not facing the third metal layer 126B are vented, as illustrated in FIG. 4L, depositing the first protective layer 141 in contact with the third metal layer 126B and the parts of the second protective layer 142 that are vented, as illustrated in FIG. 4M, locally etching the first and second protective layers 142, 142 so as to laterally delimit the detection structure 10, said etching opening into the first layer of sacrificial material 431, as illustrated in FIG. 4N, selectively removing the sacrificial materials from the first, second and third layers of sacrificial material 431, 432, 431, the detection structure 10 according to the invention being thus formed and in accordance with FIG. 1.

It can be noted that, according to the possibility in which the masking layer 122 is made of an unintentionally doped polycrystalline silicon pSi, provision is made prior to the second implantation step, for forming a pre-implantation protective layer in contact with the masking layer, this being to prevent any implantation of the latter, a step of withdrawing this pre-implantation protective layer then being implemented after the second implantation step.

According to a first alternative, the manufacturing method may not include a step of locally etching the first semiconductor layer 113P so as to keep only the parts of the first semiconductor layer 113P for forming the first, third and fourth zones 111, 113, 112, the first semiconductor layer then being etched during the step of selectively etching with respect to $SiO_2$ and SiN, the parts of the first semiconductor layer 113P that are not protected by the first conductive layer 121/masking layer 122 assembly and the first and second lateral extension elements 134.

According to a second particularly advantageous alternative of the invention, the structure 10 can comprise means for biasing the third zone 113, such as an ohmic contact passing through the third insulating layer.

According to a third alternative, the structure 10 may not comprise a third metal layer 126B, the first metal layer 127 comprising a portion extending in contact with the third insulating layer 133 and forming the absorbing element 128. In accordance with this alternative, the second metal layer 127 preferentially has the configuration described in relation to the third metal layer, namely that it meets, with the third insulating layer 133 which supports it, the following inequalities: $150\Omega \le \rho/Ep \le 700\Omega$ with $\rho$ the equivalent resistivity of said layers and Ep the sum of the thicknesses of said layers.

Figure 5:
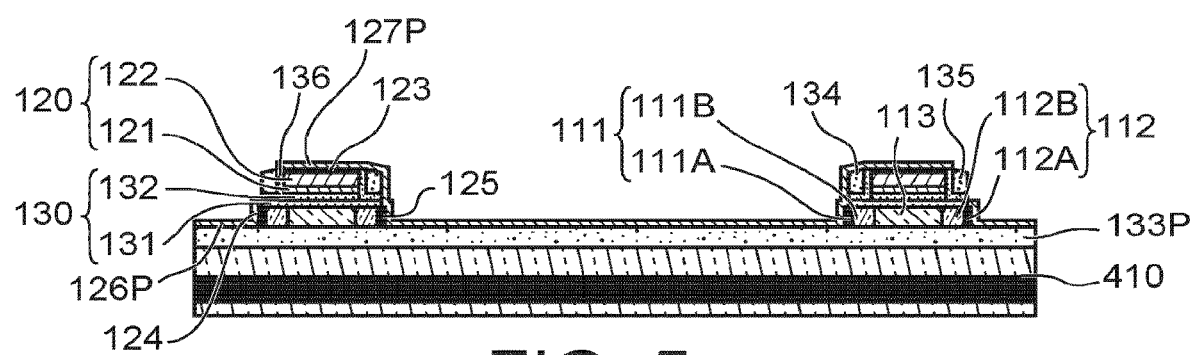
FIG. 5 illustrates, by means of a cross-section view, a step of forming a first metal layer upon manufacturing a structure according to an alternative of the invention in which the first metal layer forms the absorbing element.

A method for manufacturing a structure according to this alternative differs in that during the step of locally etching the metal layer 126P, the second metal layer has a portion extending in contact with the third insulating layer 133P, said portion extending beyond the first semiconductor layer, as illustrated in FIG. 5, and in that no steps are provided in connection with the third metal layer 126B and especially no step of depositing the third metal layer 126B and etching the latter.

Finally, it will be noted that although the gate electrode 120 preferably comprises a first conductive layer 121 made of a "mid-gap" type metal, it is also contemplatable, without departing from the scope of the invention, for the first conductive layer to be made of a metal other than a "mid-gap" metal.

It will be noted that, as already indicated, the description of the present embodiment makes it possible to illustrate the principle of the invention and its implementation and is therefore by no means limiting. The person skilled in the art is in fact able to apply the concept of the invention to other detection structures of prior art which, being of the bolometer type, would use a transistor as a transducer. It will thus be noted, in particular, that the configuration of the absorbing element described in the context of the present embodiment is only provided by way of example.

The invention claimed is:

1. A method for manufacturing a detection structure for detecting electromagnetic radiations, the detection structure comprising a MOS transistor as a transducer, the method comprising:

providing a semiconductor layer having a first concentration of majority carriers, said semiconductor layer being either of an intrinsic type or of a first conductivity type, depositing at least one first dielectric material onto the surface of the semiconductor layer to form at least one first insulating layer, depositing a first conductive material in contact with the at least one first insulating layer to form a first conductive layer, depositing a masking layer in contact with the first conductive layer, locally etching the masking layer and the conductive layer in order to form a masking layer/first conductive layer assembly, the first conductive layer, after being locally etched, at least partly forming a gate electrode of the MOS transistor by covering a first part of the first semiconductor layer, first implanting of doping elements into the semiconductor layer, the first part of the semiconductor layer being protected by the masking layer/first conductive layer assembly, and said implantation being carried out with a first dose configured to provide a second concentration of majority carriers higher than the first concentration, said doping elements providing majority carriers of a given conductivity type, forming a first and a second lateral extension element made of at least one dielectric material in contact with the first insulating layer on either side of the masking layer/first conductive layer assembly and, said first and second lateral extension elements extending from the masking layer/first conductive layer assembly opposite to each other, second implanting of doping elements into the semiconductor layer, a second part of the semiconductor layer, comprising the first part of the semiconductor layer, being protected by the masking layer/first conductive layer assembly and the first and second lateral extension elements extending therefrom, said second implantation being carried out with a second dose higher than the first dose and configured to provide a third concentration of majority carriers higher than the second concentration, said doping elements providing majority carriers of the given conductivity type, thermally annealing the semiconductor layer, the thermal annealing diffusing and activating the doping elements implanted during the first and second implantation, so as to form a first and second zone of the transistor with, for each of the first and second zones, a first region having a concentration of majority carriers higher than the second concentration and a second region having a concentration of majority carriers equal to or lower than the second concentration, said first region being partly covered with the first and second lateral extension elements, respectively, said first and second zones being separated from each other by a third zone of the transistor covered with the first insulating layer, locally etching the parts of the semiconductor layer not protected by the masking layer/first conductive layer assembly and the first and second lateral extension elements which extend therefrom, said locally etching the parts resulting in keeping only the parts of the first regions of each of the first and second zones protected by the first and second lateral extensions and, if applicable, by the masking layer/first conductive layer assembly, thus one end of each first and second lateral extension element is aligned with a respective flank of the semiconductor layer along a direction perpendicular to a plane of the semiconductor layer, depositing at least one second conductive material to form first and second metal contacts, each of the first and second metal contacts being in contact with the semiconductor layer only on the etch flank corresponding to the first and second lateral extension elements, respectively, at least one of the first and second metal contacts forming an absorbing element configured to absorb the electromagnetic radiation, the MOS transistor being thus formed.

2. The method for manufacturing a detection structure according to claim 1, wherein during the step of forming a masking layer, the masking layer is made of an at least partially conductive material, and wherein the gate electrode is formed by the masking layer and the at least one first conductive material.

3. The method for manufacturing a detection structure according to claim 2, wherein the material of the masking layer is a polycrystalline silicon.

4. The method for manufacturing a detection structure according to claim 1, wherein the material of the masking layer is unintentionally doped polycrystalline silicon, the gate electrode being formed by the at least one first conductive material and the masking layer being provided with an opening to allow biasing of the gate electrode.

5. The method for manufacturing a detection structure according to claim 1, further comprising between the step of locally etching the parts of the semiconductor layer and the step of depositing at least one second conductive material, a step of siliciding the etch flanks corresponding to the first and second lateral extension elements respectively.

6. The method for manufacturing a detection structure according to claim 1, wherein upon depositing the at least one first conductive material and the at least one second conductive material, the at least one of the first and second metal contacts forming the absorbing element extends beyond the semiconductor layer.

7. The method for manufacturing a detection structure according to claim 1, wherein, after the step of selectively etching the parts of the semiconductor layer not protected by the masking layer/first conductive layer assembly and the first and second lateral extension elements extending therefrom, the semiconductor layer at least partly surrounds a zone of an absorption plane defined by the absorbing element, the absorbing element extending at least partly over said zone of said absorption plane.

8. The method for manufacturing a detection structure according to claim 7, wherein the absorbing element comprises a metal layer and is supported by a dielectric layer, the metal of the metal layer of the absorbing element and thicknesses of said layer and the dielectric layer supporting it chosen so as to meet the following inequalities: $150\Omega \leq \rho/Ep \leq 700\Omega$ with $\rho$ an equivalent resistivity of said layers and $Ep$ a sum of the thicknesses of said layers.

9. A detection structure for detecting electromagnetic radiations, the structure comprising:
a MOS transistor as a transducer,
the MOS transistor comprising:
a first and a second zone of a given conductivity type and a third zone of a first conductivity type opposite to a second conductivity type, the third zone separating the first and second zones from each other, said first, second, and third zones being arranged in a semiconductor layer, the third zone having a first concentration of majority carriers and the first and second zones each having a concentration of majority carriers higher than the first concentration by including a first region and a second region, said first regions having a concentration of majority carriers higher than a second concentration of majority carriers and said second regions having a concentration of majority carriers equal to or lower than said second concentration, said second concentration being higher than the first concentration, at least one first insulating layer made of at least one first dielectric material in contact with the semiconductor layer and covering said first, second, and third zones, a first conductive layer made of a first conductive material in contact with the at least one first insulating layer and participating in formation of a gate electrode of the MOS transistor, a first and second lateral extension element made of a dielectric material in contact with the insulating layer and extending from the first conductive layer opposite to each other, said first and second lateral extension elements at least partly covering the first regions of the first and second zones with one end of each first and second lateral extension elements aligned with a respective flank of the semiconductor layer along a direction perpendicular to a plane of the semiconductor layer, at least one first and one second metal contact, each of the first and second metal contacts being in contact with the semiconductor layer only on the flank of the semiconductor layer corresponding to the first and second lateral extension elements, respectively, at least one of the first and second metal contacts forming an absorbing element configured to absorb the electromagnetic radiation.

10. The detection structure of claim 9, further comprising a masking layer covering the first conductive layer.

11. The detection structure according to claim 10, wherein the material of the masking layer is a doped polycrystalline silicon, said masking layer forming, together with the first conductive layer, a gate electrode.

12. The detection structure according to claim 10, wherein the material of the masking layer is an unintentionally doped polycrystalline silicon, the gate electrode being formed by the first conductive layer, and the masking layer being provided with an opening to allow biasing of the gate electrode.

13. The detection structure according to claim 9, wherein the semiconductor layer at least partly surrounds a zone of an absorption plane defined by the absorbing element, the absorbing element at least partly extending over said zone of said absorption plane.

14. The detection structure according to claim 9, wherein the absorbing element comprises a metal layer and is supported by a dielectric layer, the metal of the metal layer of the absorbing element and thicknesses of said layer and the dielectric layer supporting it chosen so as to meet the following inequalities: $150\Omega \leq \rho/Ep \leq 700\Omega$ with $\rho$ an equivalent resistivity of said layers and $Ep$ a sum of the thicknesses of said layers.

15. The detection structure according to claim 9, wherein the absorbing element extends along an absorption plane with a majority portion of the absorbing element being outside a projection of the semiconductor layer onto said absorption plane.

16. The detection structure according to claim 9, wherein the semiconductor layer comprises on each of the flanks corresponding to the first and second lateral extension elements, respectively, a contact layer formed of a silicide material.

* * * * *